(12) United States Patent
Kim et al.

(10) Patent No.: US 11,825,703 B2
(45) Date of Patent: Nov. 21, 2023

(54) DISPLAY DEVICE AND METHOD FOR MANUFACTURING THEREOF

(71) Applicant: Samsung Display Co., LTD., Yongin-si (KR)

(72) Inventors: Jay Bum Kim, Yongin-si (KR); Myeong Ho Kim, Hwaseong-si (KR); Yeon Hong Kim, Hwaseong-si (KR); Kyoung Seok Son, Seoul (KR); Sun Hee Lee, Seoul (KR); Seung Jun Lee, Suwon-si (KR); Seung Hun Lee, Seoul (KR); Jun Hyung Lim, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 224 days.

(21) Appl. No.: 17/242,303

(22) Filed: Apr. 28, 2021

(65) Prior Publication Data
US 2022/0045147 A1 Feb. 10, 2022

(30) Foreign Application Priority Data
Aug. 10, 2020 (KR) .................. 10-2020-0099934

(51) Int. Cl.
*H01L 27/00* (2006.01)
*H01L 29/00* (2006.01)
(Continued)

(52) U.S. Cl.
CPC ......... *H10K 59/124* (2023.02); *H10K 59/131* (2023.02); *H01L 27/1222* (2013.01); *H01L 29/786* (2013.01); *H10K 59/1201* (2023.02)

(58) Field of Classification Search
CPC ............... H01L 27/124; H01L 27/3276; H01L 27/3265; H01L 29/786509;
(Continued)

(56) References Cited

U.S. PATENT DOCUMENTS 10,622,430 B2 * 4/2020 Jeong .................. H01L 51/0554
10,811,445 B2 * 10/2020 Murai ................. H01L 27/1248
(Continued)

FOREIGN PATENT DOCUMENTS

EP 3174097 5/2017
EP 3471145 4/2019
(Continued)

OTHER PUBLICATIONS

Extended European Search Report—European Patent Application No. 21190242.4 dated Jul. 1, 2022, citing references number listed within.
(Continued)

*Primary Examiner* — Nikolay K Yushin
(74) *Attorney, Agent, or Firm* — CANTOR COLBURN LLP

(57) ABSTRACT

A display device includes a substrate, a first transistor including a channel on the substrate, a first electrode and a second electrode, and a gate electrode overlapping the channel of the first transistor, a first interlayer insulation layer on the first and second electrodes of the first transistor, a second transistor including a channel disposed on the first interlayer insulation layer, a first electrode and a second electrode of the second transistor, and a gate electrode that overlaps the channel of the second transistor, a first connection electrode disposed on the first interlayer insulation layer, and connected with the first electrode of the first transistor, a gate insulation layer disposed between the first interlayer insulation layer and the first connection electrode, and a second connection electrode that connects the first connection electrode and the first electrode of the second transistor.

26 Claims, 27 Drawing Sheets

(51) Int. Cl.
*H10K 59/124* (2023.01)
*H10K 59/131* (2023.01)
*H10K 59/12* (2023.01)
*H01L 29/786* (2006.01)
*H01L 27/12* (2006.01)

(58) Field of Classification Search
CPC ......... H01L 29/66696; H01L 29/78678; H01L 27/1222; H01L 27/12; H01L 27/1225; H01L 27/1248; H01L 27/1259; H01L 29/78633; H01L 29/786; H10K 59/124; H10K 59/131; H10K 59/12; H10K 59/123; H10K 59/1213; H10K 59/121; H10K 59/1216; H10K 71/00
See application file for complete search history.

(56) References Cited

U.S. PATENT DOCUMENTS

| | | | |
|---|---|---|---|
| 11,107,844 B2* | 8/2021 | Je | H01L 21/02667 |
| 11,177,288 B2* | 11/2021 | Lee | H01L 27/1259 |
| 2016/0307988 A1 | 10/2016 | Kim et al. | |
| 2017/0155000 A1 | 6/2017 | Moon et al. | |
| 2018/0158848 A1* | 6/2018 | Murai | H01L 27/1248 |
| 2018/0286307 A1 | 10/2018 | Kim et al. | |
| 2018/0286888 A1* | 10/2018 | Yamaguchi | H01L 29/4908 |
| 2019/0115407 A1 | 4/2019 | Cho et al. | |
| 2019/0198534 A1* | 6/2019 | Je | H01L 27/1225 |
| 2019/0252479 A1 | 8/2019 | Kang et al. | |
| 2019/0288048 A1 | 9/2019 | Kang et al. | |
| 2019/0305065 A1* | 10/2019 | Kim | H01L 27/3262 |
| 2019/0378886 A1* | 12/2019 | Jeong | H01L 27/1225 |
| 2020/0043955 A1 | 2/2020 | Suzuki et al. | |
| 2020/0066765 A1 | 2/2020 | Cho et al. | |
| 2020/0135772 A1* | 4/2020 | Lee | G09G 3/3233 |
| 2021/0036082 A1 | 2/2021 | Cho et al. | |
| 2021/0273032 A1 | 9/2021 | Kim et al. | |
| 2021/0359063 A1 | 11/2021 | Lu et al. | |

FOREIGN PATENT DOCUMENTS

| | | |
|---|---|---|
| EP | 3557623 | 10/2019 |
| EP | 3614432 | 2/2020 |
| JP | 201874076 | 5/2018 |
| KR | 1020070072207 | 7/2007 |
| KR | 1020180030275 | 3/2018 |
| KR | 1020190115135 | 10/2019 |
| KR | 1020190132603 | 11/2019 |
| KR | 1020200029103 | 3/2020 |
| WO | 2019169848 | 9/2019 |

OTHER PUBLICATIONS

Partial European Search Report—European Patent Application No. 21190242.4 dated Jan. 14, 2022, citing references listed within.

* cited by examiner

FIG. 4

| ACT1 (LTPS) |
|:-:|
| GAT1 |
| GAT2 |
| ACT2 (Oxide) |
| CNT1 |
| GAT3 |
| GAT4 |
| CNT2 |
| SD |

DISPLAY DEVICE AND METHOD FOR MANUFACTURING THEREOF

This application claims priority to and priority to Korean Patent Application No. 10-2020-0099934 filed on Aug. 10, 2020, and all the benefits accruing therefrom under 35 U.S.C. § 119, the content of which in its entirety is herein incorporated by reference.

BACKGROUND

1. Field

Embodiments of the invention relate to a display device and a manufacturing method thereof.

2. Description of the Related Art

An organic light emitting diode ("OLED") display includes two electrodes and an organic emission layer disposed between the two electrodes, and an electron injected from one electrode of the two electrodes and a hole injected from the other electrode of the two electrodes are combined in the organic emission layer such that an exciton is formed. As the exciton changes from an exited state to a ground state, it emits energy and thus emits light.

Such an OLED display includes a plurality of pixels, each including an OLED, which is a self-emissive element, and a plurality of transistors for driving the OLED, and at least one capacitor is formed in each pixel.

SUMMARY

In order to connect a plurality of transistors to each other, an opening may be defined in an insulation layer, and a connection electrode that is connected through the opening may be formed. As a number of openings increases, a distance between electrodes of an organic light emitting diode may increase, and accordingly, a size of each pixel may increase. Therefore, there is a problem of implementing high resolution. Embodiments have been made an effort to implement a high-resolution display device by reducing a size of each pixel through reduction of the number of openings that connect a plurality of transistors.

A display device in an embodiment includes a substrate, a first transistor including a channel that is disposed on the substrate, a first electrode and a second electrode of the first transistor respectively disposed at opposite sides of the channel of the first transistor, and a gate electrode overlapping the channel of the first transistor, a first interlayer insulation layer that is disposed on the first electrode and the second electrode of the first transistor, a second transistor including a channel disposed on the first interlayer insulation layer, a first electrode and a second electrode respectively disposed at opposite sides of the channel of the second transistor, and a gate electrode of that overlaps the channel of the second transistor, a first connection electrode that is disposed on the first interlayer insulation layer, and connected with the first electrode of the first transistor, a gate insulation layer that is disposed between the first interlayer insulation layer and the first connection electrode, and a second connection electrode that connects the first connection electrode and the first electrode of the second transistor.

In an embodiment, the second connection electrode may be disposed directly above the first connection electrode, and the second connection electrode and the first connection electrode may contact each other.

In an embodiment, the second connection electrode may be disposed directly above the first electrode of the second transistor, and the second connection electrode and the first electrode of the second transistor may contact each other.

In an embodiment, a first opening that overlaps at least a part of the first electrode of the first transistor may be defined in the first interlayer insulation and the gate insulation layer, and the first connection electrode is connected with the first electrode of the first transistor through the first opening.

In an embodiment, a planar shape of the first connection electrode may be the same as a planar shape of the gate insulation layer.

In an embodiment, the gate electrode of the second transistor may include a first gate electrode and a second gate electrode, the gate insulation layer may be further disposed between first gate electrode of the second transistor and the channel of the second transistor, the first connection electrode may be disposed in a same layer as the first gate electrode of the second transistor, and the second connection electrode may be disposed in a same layer as the second gate electrode of the second transistor.

In an embodiment, the channel, the first electrode, and the second electrode of the first transistor may include a polycrystalline semiconductor material, and the channel, the first electrode, and the second electrode of the second transistor may include an oxide semiconductor material.

In an embodiment, the display device may further include an initialization voltage line that is disposed on the substrate, a third transistor including a channel disposed on the first interlayer insulation layer, a first electrode and a second electrode of the third transistor respectively disposed at opposite sides of the channel of the third transistor, and a gate electrode overlapping the channel of the third transistor, a third connection electrode that is connected to the initialization voltage line, and a fourth connection electrode that is disposed directly above the third connection electrode and the first electrode of the third transistor, where the first interlayer insulation layer and the gate insulation layer may be further disposed between the initialization voltage line and the third connection electrode, a first opening that overlaps the initialization voltage line may be defined in the first interlayer insulation layer and the gate insulation layer, the third connection electrode may be connected with the initialization voltage line through the first opening, and the second electrode of the third transistor and the second electrode of the second transistor may be connected to each other.

In an embodiment, the display device may further include a protection pad that is disposed on the second electrode of the second transistor, where the protection pad may be disposed in a same layer as the second connection electrode.

In an embodiment, the display device may further include a second interlayer insulation layer that is disposed on the protection pad, and a third connection electrode that is disposed on the second interlayer insulation layer, and connects the gate electrode of the first transistor and the protection pad, where a first opening that overlaps the protection pad may be defined in the second interlayer insulation layer, and the third connection electrode may be connected with the protection pad through the first opening.

In an embodiment, the display device may further include a light blocking layer that overlaps the channel and the gate electrode of the second transistor, where the first interlayer insulation layer and the gate insulation layer may be further disposed between the light blocking layer and the gate electrode of the second transistor, a first opening that overlaps the light blocking layer may be defined in the first interlayer insulation layer and the gate insulation layer, and the gate electrode of the second transistor may be connected with the light blocking layer through the first opening.

In an embodiment, the display device may further include a first storage electrode that overlaps the gate electrode of the first transistor, where the first storage electrode may include a same material as a material of the channel, the first electrode, and the second electrode of the second transistor, and may be disposed in a same layer as the channel, the first electrode, and the second electrode of the second transistor.

A manufacturing method of a display device in an embodiment includes forming a channel of a first transistor on a substrate, and a first electrode and a second electrode respectively disposed at opposite sides of the channel, forming a gate electrode of the first transistor, overlapping the channel of the first transistor, forming a first interlayer insulation layer on the gate electrode of the first transistor, forming a channel of a second transistor on the first interlayer insulation layer, and a first electrode and a second electrode that are respectively disposed at opposite sides of the channel of the second transistor, forming a gate insulation layer on the channel, the first electrode, and the second electrode of the second transistor, and the first interlayer insulation layer, defining a first opening that overlaps the first electrode of the first transistor in the gate insulation layer and the first interlayer insulation layer, forming a first connection electrode that is connected with the first electrode of the first transistor through the first opening on the gate insulation layer, removing a portion of the gate insulation layer, disposed on the first electrode of the second transistor by etching the gate insulation layer using the first connection electrode as a mask, and forming a second connection electrode that connects the first connection electrode and the first electrode of the second transistor.

In an embodiment, the second connection electrode may be disposed directly above the first connection electrode, and the second connection electrode and the first connection electrode may contact each other.

In an embodiment, the second connection electrode may be disposed directly above the first electrode of the second transistor, and the second connection electrode and the first electrode of the second transistor may contact each other.

In an embodiment, a planar shape of the first connection electrode may be the same as a planar shape of the gate insulation layer.

In an embodiment, in the forming the first connection electrode, a first gate electrode of the second transistor may overlap the channel of the second transistor, a first gate electrode of the second transistor overlaps the channel of the second transistor in the forming the first connection electrode, and a second gate electrode of the second transistor may overlap the channel of the second transistor in the forming the second connection electrode.

In an embodiment, the second gate electrode of the second transistor may be disposed directly above the first gate electrode of the second transistor, and the second gate electrode of the second transistor and the first gate electrode of the second transistor may contact each other.

In an embodiment, the channel, the first electrode, and the second electrode of the first transistor may include a polycrystalline semiconductor material, and the channel, the first electrode, and the second electrode of the second transistor may include an oxide semiconductor material.

The manufacturing method of the display device in the embodiment may further include forming an initialization voltage line on the substrate, where in the forming the channel, the first electrode, and the second electrode of the second transistor, a channel of a third transistor, disposed on the first interlayer insulation layer, and a first electrode and a second electrode that are respectively disposed at opposite sides of the channel of the third transistor may be formed, a second opening that overlaps the initialization voltage line may be formed in the gate insulation layer and the first interlayer insulation layer in the defining the first opening, a third connection electrode that is connected with the initialization voltage line through the second opening may be defined in the forming the first connection electrode, a portion of the gate insulation layer, disposed on the first electrode of the third transistor may be removed by etching the gate insulation layer using the third connection electrode as a mask in the removing of the portion of the gate insulation layer, disposed on the first electrode of the second transistor, and forming a fourth connection electrode that connects the third connection electrode and the initialization voltage line in the forming the second connection electrode.

In an embodiment, the fourth connection electrode may be disposed directly above the third connection electrode, and the fourth connection electrode and the third connection electrode may contact each other.

In an embodiment, the fourth connection electrode may be disposed directly above the first electrode of the third transistor, and the fourth connection electrode and the first electrode of the third transistor may contact each other.

In an embodiment, in the forming the second connection electrode, a protection pad may be formed on the second electrode of the second transistor.

In an embodiment, the manufacturing method of the display device may further include forming a second interlayer insulation layer on the protection pad, defining a second opening that overlaps the protection pad in the second interlayer insulation layer, and forming a third connection electrode that is connected with the protection pad through the second opening on the second interlayer insulation layer, where the third connection electrode connects the gate electrode of the first transistor and the protection pad.

In an embodiment, the manufacturing method of the display device in the embodiment may further include forming a light blocking layer that overlaps the channel and the gate electrode of the second transistor, a second opening that overlaps the light blocking layer may be defined in the defining the first opening, a first gate electrode of the second transistor, connected with the light blocking layer through the second opening, may be formed in the forming the first connection electrode, and a second gate electrode of the second transistor may be formed on the first gate electrode of the second transistor in the forming the second connection electrode.

In an embodiment, a first storage electrode that overlaps the gate electrode of the first transistor may be formed in the forming the channel, the first electrode, and the second electrode of the second transistor.

According to the embodiments, a high-resolution display device may be implemented by reducing a size of each pixel through reduction of a number of openings that connect a plurality of transistors.

BRIEF DESCRIPTION OF THE DRAWINGS

The above and other embodiments, advantages and features of this disclosure will become more apparent by describing in further detail embodiments thereof with reference to the accompanying drawings, in which:

FIG. 4 shows a manufacturing an embodiment of sequence of each layer of the display device.

DETAILED DESCRIPTION

Figure 1:
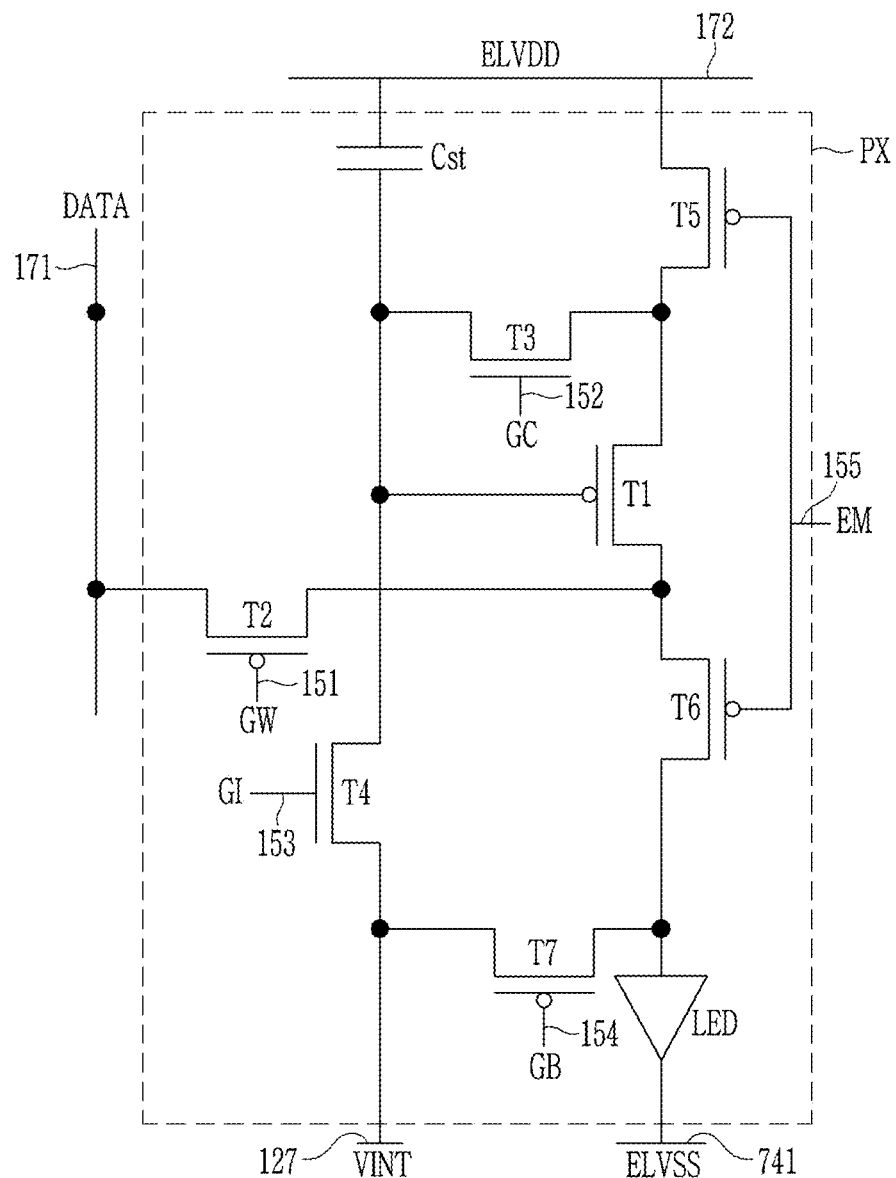
FIG. 1 is a circuit diagram of an embodiment of a display device.

Hereinafter, the invention will be described more fully with reference to the accompanying drawings, in which embodiments of the invention are shown. As those skilled in the art would realize, the described embodiments may be modified in various different ways, all without departing from the spirit or scope of the invention. The drawings and description are to be regarded as illustrative in nature and not restrictive. Like reference numerals designate like elements throughout the specification.

In addition, since the size and thickness of each component shown in the drawings are arbitrarily shown for better understanding and ease of description, the invention is not necessarily limited to what is shown. In the drawings, the thickness of layers, films, panels, regions, etc., are exaggerated for clarity. In addition, in the drawings, for better understanding and ease of description, the thickness of some layers and regions is exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. It will be understood that when an element such as a layer, film, region, or substrate is referred to as being "on" another element, it can be directly on the other element or intervening elements may also be present.

In addition, unless explicitly described to the contrary, the word "comprise", and variations such as "comprises" or "comprising" will be understood to imply the inclusion of stated elements but not the exclusion of any other elements.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

First, referring to FIG. 1, a display device in an embodiment will be described.

FIG. 1 is a circuit diagram of an embodiment of a display device.

As shown in FIG. 1, one pixel PX of a display device in an embodiment includes a plurality of transistors T1, T2, T3, T4, T5, T6, and T7 that are connected to multiple wires 127, 151, 152, 153, 154, 155, 171, 172, and 741, a storage capacitor Cst, and a light emitting diode LED.

One pixel PX is connected with the plurality of wires 127, 151, 152, 153, 154, 155, 171, 172, and 741. The plurality of wires includes an initialization voltage line 127, a first scan line 151, a second scan line 152, an initialization control line 153, a bypass control line 154, a light emission control line 155, a data line 171, a driving voltage line 172, and a common voltage line 741.

The first scan line 151 is connected to a gate driver (not shown) and transmits a first scan signal GW to a second transistor T2. The second scan line 152 may be applied with a voltage having a polarity opposite to a polarity of a voltage applied to the first scan line 151 at the same timing as that of a signal of the first scan line 151. In an embodiment, when a negative voltage is applied to the first scan line 151, a positive voltage may be applied to the second scan line 152, for example. The second scan line 152 transmits a second scan signal GC to a third transistor T3.

The initialization control line 153 transmits an initialization control signal GI to a fourth transistor T4. The bypass control line 154 transmits a bypass signal GB to a seventh transistor T7. The bypass control line 154 may include a previous or next first scan line 151. The light emission control line 155 transmits a light emission control signal EM to a fifth transistor T5 and a sixth transistor T6.

The data line 171 is a wire that transmits data voltage DATA generated from a data driver (not shown), and luminance of the light emitting diode LED changes according to the data voltage DATA applied to the pixel PX.

The driving voltage line 172 applies a driving voltage ELVDD. The initialization voltage line 127 transmits an initialization voltage VINT. The common voltage line 741 applies a common voltage ELVSS to a cathode of the light emitting diode LED. In the illustrated embodiment, a voltage applied to the driving voltage line 172, a voltage applied to the initialization voltage line 127, and a voltage applied to the common voltage line 741 may be respectively constant voltages.

Hereinafter, the structure and connection relationship of the plurality of transistors will be described in detail.

The driving transistor (also referred to as a first transistor) T1 may have a P-type transistor characteristic, and may include a polycrystalline semiconductor. The driving transistor T1 is a transistor that controls intensity of a current output to an anode of the light emitting diode LED according to the data voltage DATA applied to a gate electrode of the driving transistor T1. Since brightness of the light emitting diode LED is controlled according to intensity of a driving current output to the anode of the light emitting diode LED, luminance of the light emitting diode LED may be adjusted according to the data voltage DATA applied to the pixel PX. For this purpose, a first electrode of the driving transistor T1 is disposed to be able to receive the driving voltage ELVDD and thus is connected with the driving voltage line 172 via the fifth transistor T5. A second electrode of the driving transistor T1 is disposed to be able to output a current toward the light emitting diode LED, and thus is connected with the anode of the light emitting diode LED via the sixth transistor T6. In addition, the second electrode of the driving transistor T1 is connected with a second electrode of the second transistor T2 and thus receives the data voltage DATA. In addition, the first electrode of the driving transistor T1 transmits the data voltage DATA applied to the second electrode to the third transistor T3. The gate electrode of the driving transistor T1 is connected with one electrode (hereinafter, referred to a second storage electrode) of the storage capacitor Cst. Thus, a voltage of the gate electrode of the driving transistor T1 is changed according to a voltage stored in the storage capacitor Cst, and accordingly, the driving current output from the driving transistor T1 is changed. In addition, the storage capacitor Cst also serves to maintain the voltage of the gate electrode of the driving transistor T1 at a constant level for one frame period.

The second transistor T2 may have a P-type transistor characteristic, and may include a polycrystalline semiconductor. The second transistor T2 is a transistor that receives the data voltage DATA into the pixel PX. A gate electrode of the second transistor T2 is connected with the first scan line 151. A first electrode of the second transistor T2 is connected with the data line 171. A second electrode of the second transistor T2 is connected with the second electrode of the driving transistor T1. When the second transistor T2 is turned on by a negative voltage among the first scan signal GW transmitted through the first scan line 151, the data voltage DATA transmitted through the data line 171 is transmitted to the second electrode of the driving transistor T1.

The third transistor T3 may have an N-type transistor characteristic, and may include an oxide semiconductor. The third transistor T3 electrically connects the first electrode and the gate electrode of the driving transistor T1. Thus, the third transistor T3 is a transistor that enables a compensation voltage, which is the data voltage DATA that is changed through the driving transistor T1, to be transmitted to a second storage electrode of the storage capacitor Cst. A gate electrode of the third transistor T3 is connected with the second scan line 152, and a first electrode of the third transistor T3 is connected with the first electrode of the driving transistor T1. A second electrode of the third transistor T3 is connected with the second storage electrode of the storage capacitor Cst and the gate electrode of the driving transistor T1. The third transistor T3 is turned on by the positive voltage of the second scan signal GC transmitted through the second scan line 152, connects the gate electrode of the driving transistor T1 and the first electrode of the driving transistor T1, and transmits a voltage applied to the gate electrode of the driving transistor T1 to the second storage electrode of the storage capacitor Cst such that the transmitted voltage is stored in the storage capacitor Cst.

The fourth transistor T4 may have an N-type transistor characteristic, and may include an oxide semiconductor. The fourth transistor T4 serves to initialize the gate electrode of the driving transistor T1 and the second storage electrode of the storage capacitor Cst. A gate electrode of the fourth transistor T4 is connected with the initialization control line 153, and a first electrode of the fourth transistor T4 is connected with the initialization voltage line 127. A second electrode of the fourth transistor T4 is connected to the second storage electrode of the storage capacitor Cst and the gate electrode of the driving transistor T1 via the second electrode of the third transistor T3. The fourth transistor T4 is turned on by the positive voltage of an initialization control signal GI transmitted through the initialization control line 153, and thus transmits the initialization voltage VINT to the gate electrode of the driving transistor T1 and the second storage electrode of the storage capacitor Cst. Accordingly, the voltage of the gate electrode of the driving transistor T1 and the storage capacitor Cst is initialized.

The fifth transistor T5 may have a P-type transistor characteristic, and may include a polycrystalline semiconductor. The fifth transistor T5 serves to transmit the driving voltage ELVDD to the driving transistor T1. A gate electrode of the fifth transistor T5 is connected with the light emission control line 155, a first electrode of the fifth transistor T5 is connected with the driving voltage line 172, and a second electrode of the fifth transistor T5 is connected with the first electrode of the driving transistor T1.

The sixth transistor T6 may have a P-type transistor characteristic, and may include a polycrystalline semiconductor. The sixth transistor T6 serves to transmit the driving current output from the driving transistor T1 to the light emitting diode LED. A gate electrode of the sixth transistor T6 is connected with the light emission control line 155, a first electrode of the sixth transistor T6 is connected with the second electrode of the driving transistor T1, and a second electrode of the sixth transistor T6 is connected with the anode of the light emitting diode LED.

The seventh transistor T7 may have a P-type transistor characteristic, and may include a polycrystalline semiconductor. The seventh transistor T7 serves to initialize the anode of the light emitting diode LED. A gate electrode of the seventh transistor T7 is connected with the bypass control line 154, a first electrode of the seventh transistor T7 is connected with the anode of the light emitting diode LED, and a second electrode of the seventh transistor T7 is connected with the initialization voltage line 127. When the seventh transistor T7 is turned on by the negative voltage of the bypass signal GB, the initialization voltage VINT is applied to the anode of the light emitting diode LED and thus the anode of the light emitting diode LED is initialized.

In the above description, one pixel PX includes seven transistors T1 to T7 and one storage capacitor Cst, but this is not restrictive, and the number of transistors, the number of capacitors, and the connection relationship therebetween may be variously modified.

In the illustrated embodiment, the driving transistor T1 may include a polycrystalline semiconductor. In addition, the third transistor T3 and the fourth transistor T4 may include an oxide semiconductor. The second transistor T2, the fifth transistor T5, the sixth transistor T6, and the seventh transistor T7 may include a polycrystalline semiconductor. However, this is not restrictive, and at least one or more of the second transistor T2, the fifth transistor T5, the sixth transistor T6, and the seventh transistor T7 may include an oxide semiconductor. In the illustrated embodiment, the third transistor T3 and the fourth transistor T4 include a semiconductor material that is different from that of the driving transistor T1 to thereby achieve stable driving and improve reliability.

Hereinafter, planar and cross-sectional structures of the driving transistor T1, the third transistor T3, the fourth transistor T4, and the like will be described in detail with reference to FIG. 2 to FIG. 18.

Figure 2:
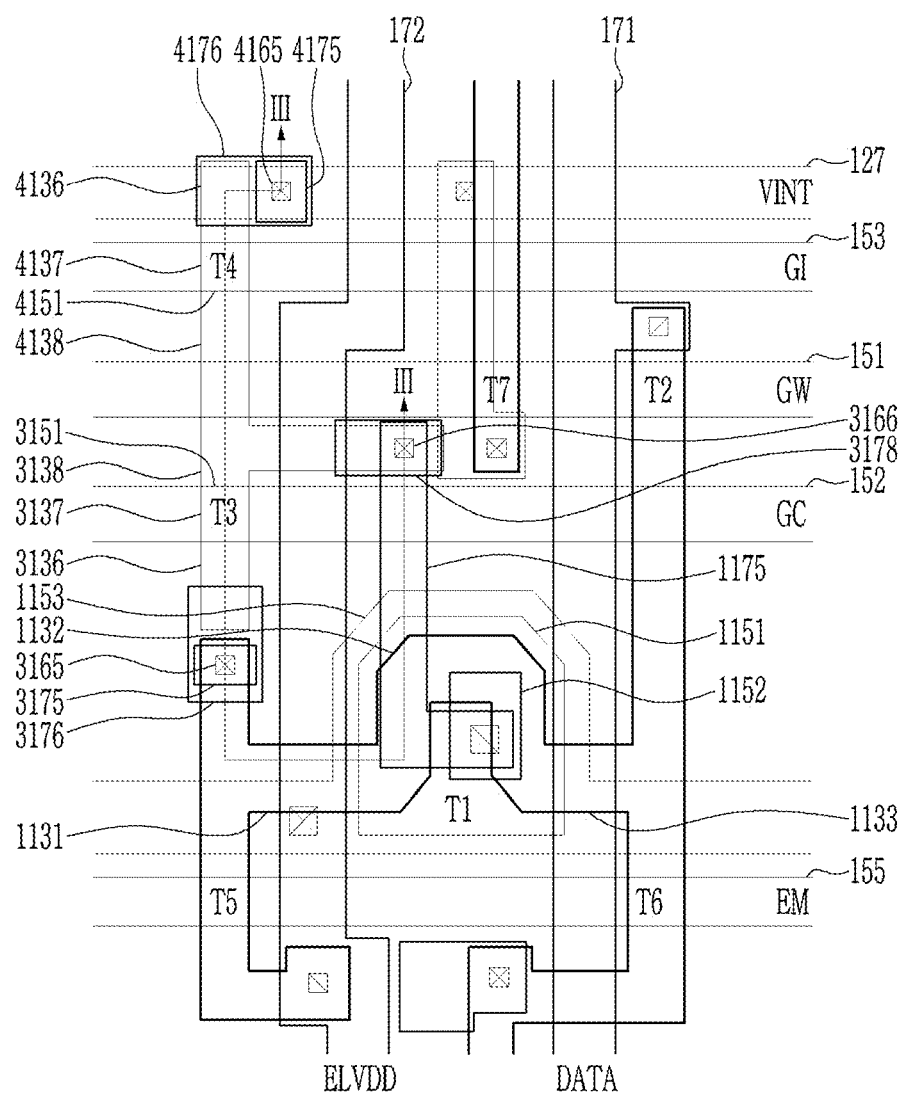
FIG. 2 is a top plan view of an embodiment of one pixel of the display device.
Figure 3:
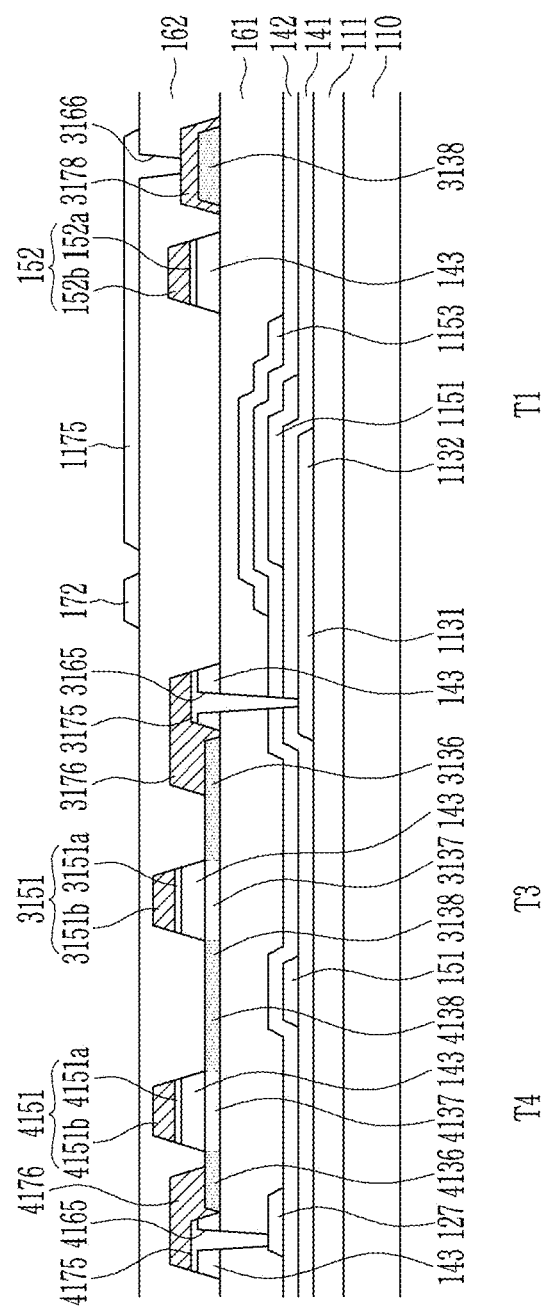
FIG. 3 is a cross-sectional view of FIG. 2, taken along line

FIG. 2 is a top plan view of an embodiment of one pixel of the display device, FIG. 3 is a cross-sectional view of FIG. 2, taken along line and FIG. 4 shows an embodiment of a manufacturing sequence of each layer of the display device. FIG. 5 to FIG. 18 are top plan or cross-sectional views that sequentially illustrate an embodiment of a manufacturing sequence of the display device. FIG. 5, FIG. 7, FIG. 9, FIG. 11, FIG. 13, FIG. 15, and FIG. 17 are top plan views, and FIG. 6, FIG. 8, FIG. 10, FIG. 12, FIG. 14, FIG. 16, and FIG. 18 are cross-sectional views. Since the seventh transistor T7 is connected to a first scan line 151 of the next stage, the seventh transistor T7 is not illustrated, and instead, a seventh transistor T7 of the previous stage is illustrated.

As shown in FIG. 4, a polycrystalline semiconductor ACT1 (LTPS), a first gate conductor GAT1, a second gate conductor GAT2, and an oxide semiconductor ACT2 (Oxide) are provided, and then an opening CNT1 may be defined in an insulation layer. Next, a third gate conductor GAT3 and a fourth gate conductor GAT4 are provided, and then an opening CNT2 may be defined. Subsequently, a data conductor SD may be provided.

Figure 5:
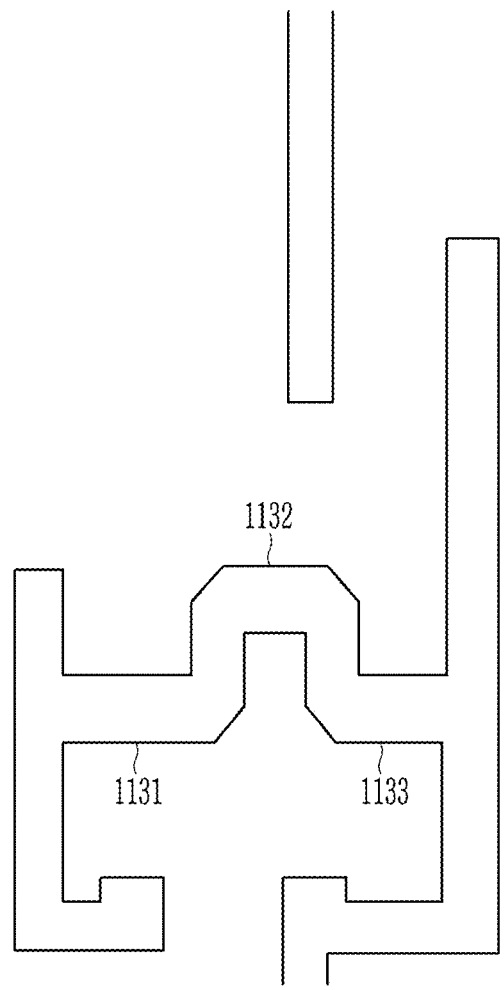
FIG. 5 to FIG. 18 are top plan or cross-sectional views that sequentially illustrate an embodiment of a manufacturing sequence of the display device.
Figure 6:
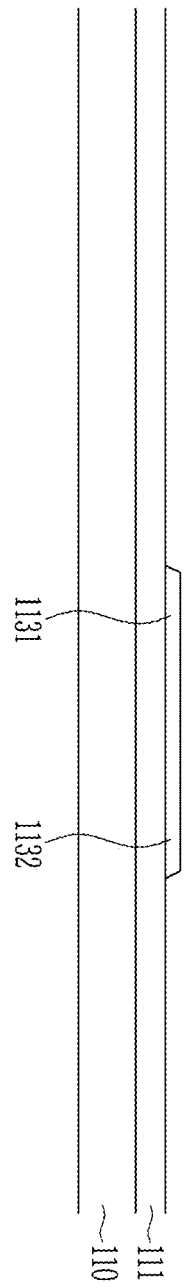

As shown in FIG. 2 to FIG. 18, the polycrystalline semiconductor ACT1 (LTPS) that includes a channel 1132, a first electrode 1131, and a second electrode 1133 of the driving transistor T1 may be disposed on a substrate 110. FIG. 5 and FIG. 6 illustrate the polycrystalline semiconductor polycrystalline semiconductor ACT1 (LTPS). The polycrystalline semiconductor ACT1 (LTPS) may further include channels, first electrodes, and second electrodes of the second transistor T2, the fifth transistor T5, the sixth transistor T6, and the seventh transistor T7 in addition to the driving transistor T1.

The channel 1132 of the driving transistor T1 may have a shape that is bent in a plan view. However, the shape of the channel 1132 of the driving transistor T1 is not limited thereto, and may be variously modified. In an embodiment, the channel 1132 of the driving transistor T1 may be bent into other shapes, and for example, may be bent into a shape of a bar, for example. The first electrode 1131 and the second electrode 1133 of the driving transistor T1 may be respectively disposed at opposite sides of the channel 1132 of the driving transistor T1. The first electrode 1131 of the driving transistor T1 extends downward in a plan view and thus may be connected with a second electrode of the fifth transistor T5. The second electrode 1133 of the driving transistor T1 vertically extends in a plan view, and a portion extended upward may be connected with a second electrode of the second transistor T2 and a portion extended downward may be connected with a first electrode of the sixth transistor T6.

A buffer layer 111 may be disposed between the substrate 110 and the polycrystalline semiconductor that includes the channel 1132, the first electrode 1131, and the second electrode 1133 of the driving transistor T1. The buffer layer 111 may have a single layer or multi-layer structure. The buffer layer 111 may include an organic insulating material or an inorganic insulating material.

A first gate insulation layer 141 may be disposed on the polycrystalline semiconductor that includes the channel 1132, the first electrode 1131, and the second electrode 1133 of the driving transistor T1. The first gate insulation layer 141 may include a silicon nitride, a silicon oxide, and the like.

Figure 7:
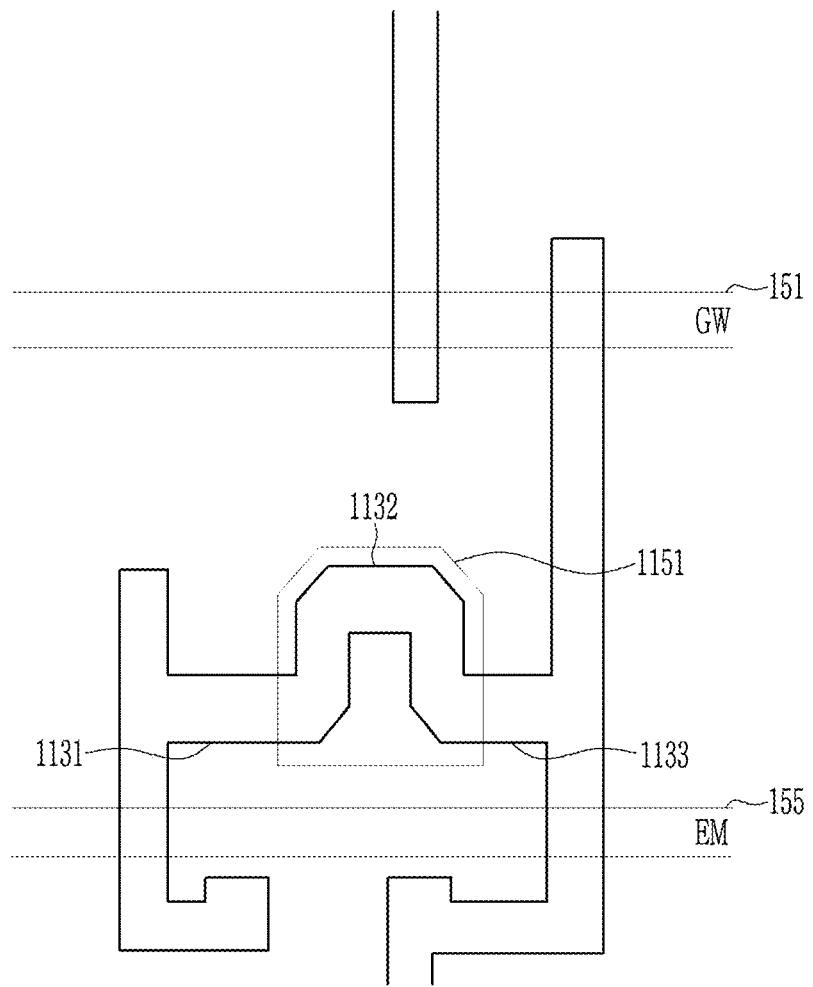
Figure 8:
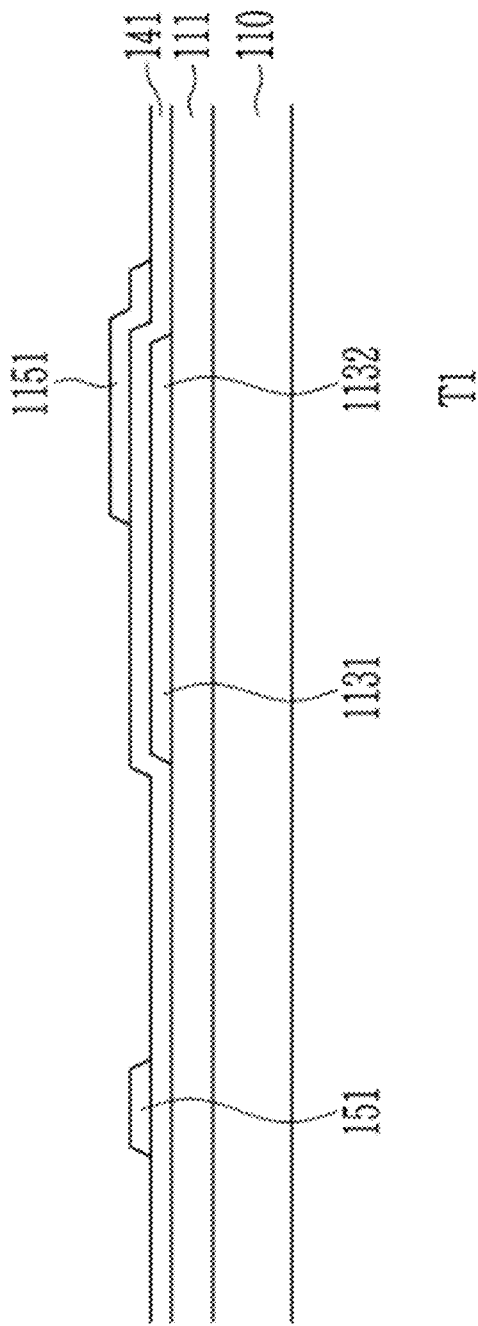

A first gate conductor GAT1 that includes the gate electrode 1151 of the driving transistor T1 may be disposed on the first gate insulation layer 141. FIG. 7 and FIG. 8 illustrate the polycrystalline semiconductor ACT1 (LTPS) and the first gate conductor GAT1. The first gate conductor GAT1 may further include gate electrodes of the second transistor T2, the fifth transistor T5, the sixth transistor T6, and the seventh transistor T7 in addition to the driving transistor T1.

The gate electrode 1151 of the driving transistor T1 may overlap the channel 1132 of the driving transistor T1. The channel 1132 of the driving transistor T1 is covered by the gate electrode 1151 of the driving transistor T1.

The first gate conductor GAT1 may further include a first scan line 151 and a light emission control line 155. The first scan line 151 and the light emission control line 155 may extend approximately in a horizontal direction. The first scan line 151 may be connected with a gate electrode of the second transistor T2. The first scan line 151 may be unitary with the gate electrode of the second transistor T2. The first scan line 151 may be connected with a gate electrode of the seventh transistor T7 that is disposed in a pixel of the previous stage. That is, a bypass control line connected to the seventh transistor T7 may include a first scan line 151 of the next stage. The first scan line 151 may be unitary with a gate electrode of the seventh transistor T7 that is disposed in the pixel of the previous stage. A gate electrode of the fifth transistor T5 and a gate electrode of the sixth transistor T6 may be connected with the light emission control line 155. The gate electrode of the fifth transistor T5 and the gate electrode of the sixth transistor T6 may be unitary with the light emission control line 155.

After forming the first gate conductor GAT1 that includes the gate electrode 1151 of the driving transistor T1, a doping process or a plasma process may be performed. A portion of the polycrystalline semiconductor ACT1 (LTPS), covered by the first gate conductor GAT1, does not experience the doping or plasma treatment, and a portion of the polycrystalline semiconductor ACT1 (LTPS), not covered by the first gate conductor GAT1, experiences doping or plasma treatment, thereby having the same characteristic as that of a conductor. In this case, a P-type dopant may be used, and the driving transistor T1, the second transistor T2, the fifth transistor T5, the sixth transistor T6, and the seventh transistor T7 that include the polycrystalline semiconductor ACT1 (LTPS) may have P-type transistor characteristics.

A second gate insulation layer 142 may be disposed on the first gate conductor GAT1 that includes the gate electrode 1151 of the driving transistor T1, and the first gate insulation layer 141. The second gate insulation layer 142 may include a silicon nitride, a silicon oxide, and the like.

Figure 9:
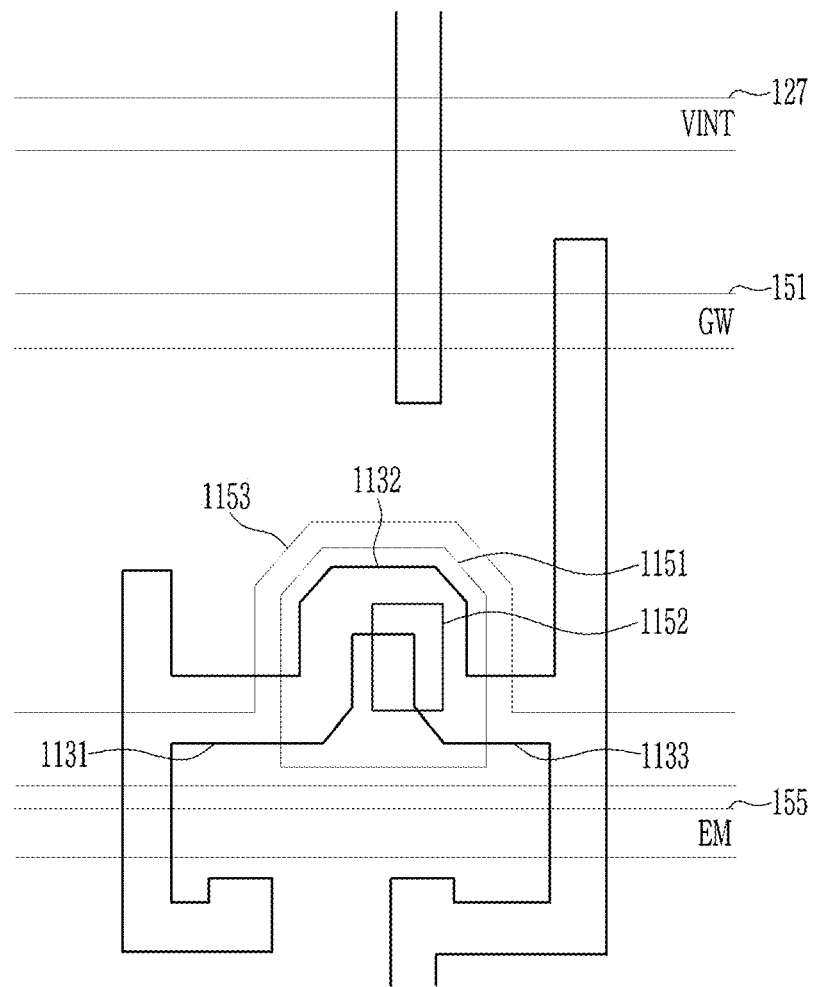
Figure 10:
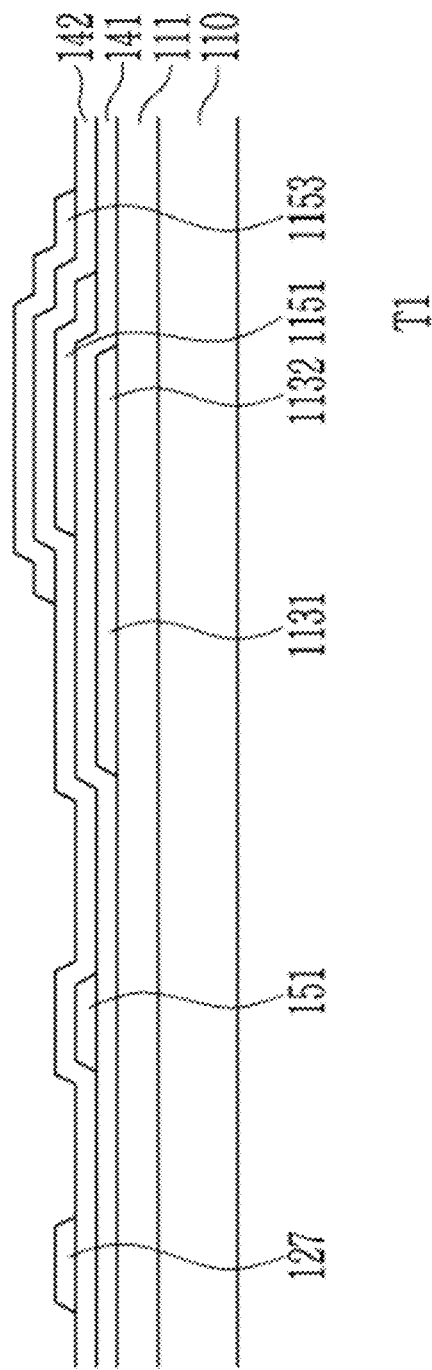

A second gate conductor GAT2 that includes a first storage electrode 1153 of the storage capacitor Cst may be disposed on the second gate insulation layer 142. FIG. 9 and FIG. 10 illustrate the polycrystalline semiconductor ACT1 (LTPS), the first gate conductor GAT1, and the second gate conductor GAT2.

The first storage electrode 1153 forms the storage capacitor Cst by overlapping the gate electrode 1151 of the driving transistor T1. An opening 1152 is defined in the first storage electrode 1153 of the storage capacitor Cst. The opening 1152 of the first storage electrode 1153 of the storage capacitor Cst may overlap the gate electrode 1151 of the driving transistor T1.

The second gate conductor GAT2 may further include an initialization voltage line 127. The initialization voltage line 127 may extend approximately in a horizontal direction.

A first interlayer insulation layer 161 may be disposed on the second gate conductor that includes the first storage electrode 1153 of the storage capacitor Cst. The first interlayer insulation layer 161 may include a silicon nitride, a silicon oxide, and the like.

Figure 11:
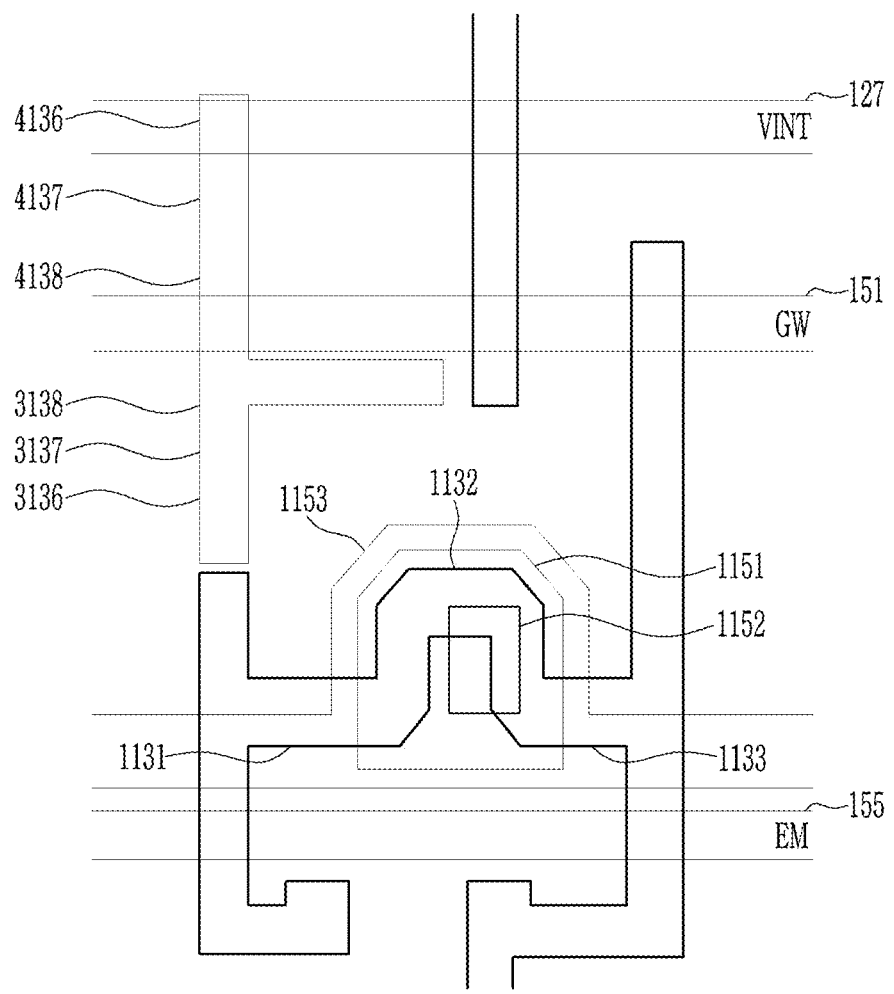
Figure 12:
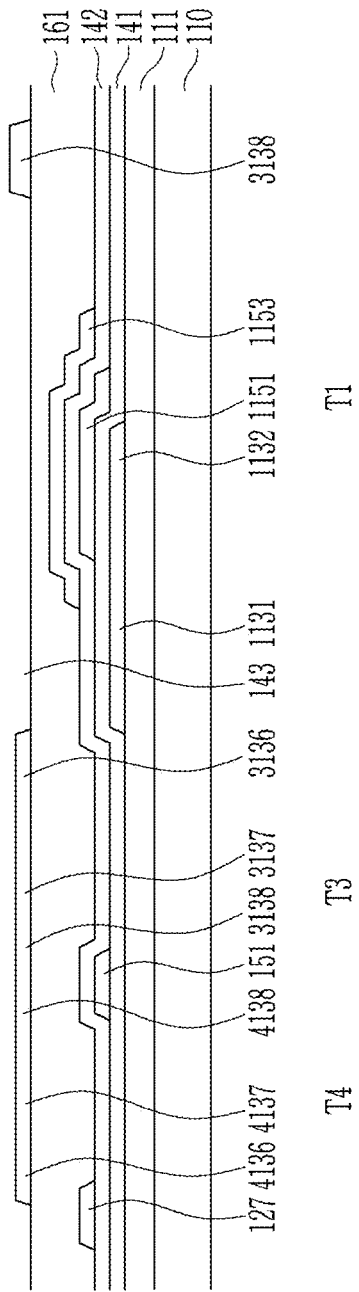

An oxide semiconductor ACT2 (Oxide) that includes a channel 3137, a first electrode 3136, and a second electrode 3138 of the third transistor T3, and a channel 4137, a first electrode 4136, and a second electrode 4138 of the fourth transistor T4, may be disposed on the first interlayer insulation layer 161. FIG. 11 and FIG. 12 illustrate the polycrystalline semiconductor ACT1 (LTPS), the first gate conductor GAT1, the second gate conductor GAT2, and the oxide semiconductor ACT2 (Oxide).

In an embodiment, the oxide semiconductor may include at least one of unary metal oxides such as indium oxide (In), tin oxide (Sn), zinc oxide (Zn), and the like, binary metal oxides such as In—Zn oxide, Sn—Zn oxide, Al—Zn oxide, Zn—Mg oxide, Sn—Mg oxide, In—Mg oxide, In—Ga oxide, and the like, ternary metal oxides such as In—Ga—Zn oxide, In—Al—Zn oxide, In—Sn—Zn oxide, Sn—Ga—Zn oxide, Al—Ga—Zn oxide, Sn—Al—Zn oxide, In—Hf—Zn oxide, In—La—Zn oxide, In—Ce—Zn oxide, In—Pr—Zn oxide, In—Nd—Zn oxide, In—Sm—Zn oxide, In—Eu— Zn oxide, In—Gd—Zn oxide, In—Tb—Zn oxide, In—Dy—Zn oxide, In—Ho—Zn oxide, In—Er—Zn oxide, In—Tm—Zn oxide, In—Yb—Zn oxide, In—Lu—Zn oxide, and the like, and quaternary metal oxides such as In—Sn—Ga—Zn oxide, In—Hf—Ga—Zn oxide, In—Al—Ga—Zn oxide, In—Sn—Al—Zn oxide, In—Sn—Hf—Zn oxide, In—Hf—Al—Zn oxide, and the like. In an embodiment, the oxide semiconductor may include indium-gallium-zinc oxide ("IGZO") among the In—Ga—Zn-based oxides, for example.

The channel 3137, the first electrode 3136, and the second electrode 3138 of the third transistor T3, and the channel 4137, the first electrode 4136, and the second electrode 4138 of the fourth transistor T4, may be connected with each other and thus may be unitary with each other. The first electrode 3136 and the second electrode 3138 of the third transistor T3 may be respectively disposed at opposite sides of the channel 3137 of the third transistor T3. The first electrode 4136 and the second electrode 4138 of the fourth transistor T4 may be respectively disposed at opposite sides of the channel 4137 of the fourth transistor T4. The second electrode 3138 of the third transistor T3 may be connected with the second electrode 4138 of the fourth transistor T4.

A third gate insulation layer 143 may be disposed on the semiconductor oxide that includes the channel 3137, the first electrode 3136, and the second electrode 3138 of the third transistor T3 and the channel 4137, the first electrode 4136, and the second electrode 4138 of the fourth transistor T4. The third gate insulation layer 143 may overlap the channel 3137 of the third transistor T3, and may not overlap the first electrode 3136 and the second electrode 3138 of the third transistor T3. In addition, the third gate insulation layer 143 may overlap the channel 4137 of the fourth transistor T4, and may not overlap the first electrode 4136 and the second electrode 4138 of the fourth transistor T4.

Figure 15:
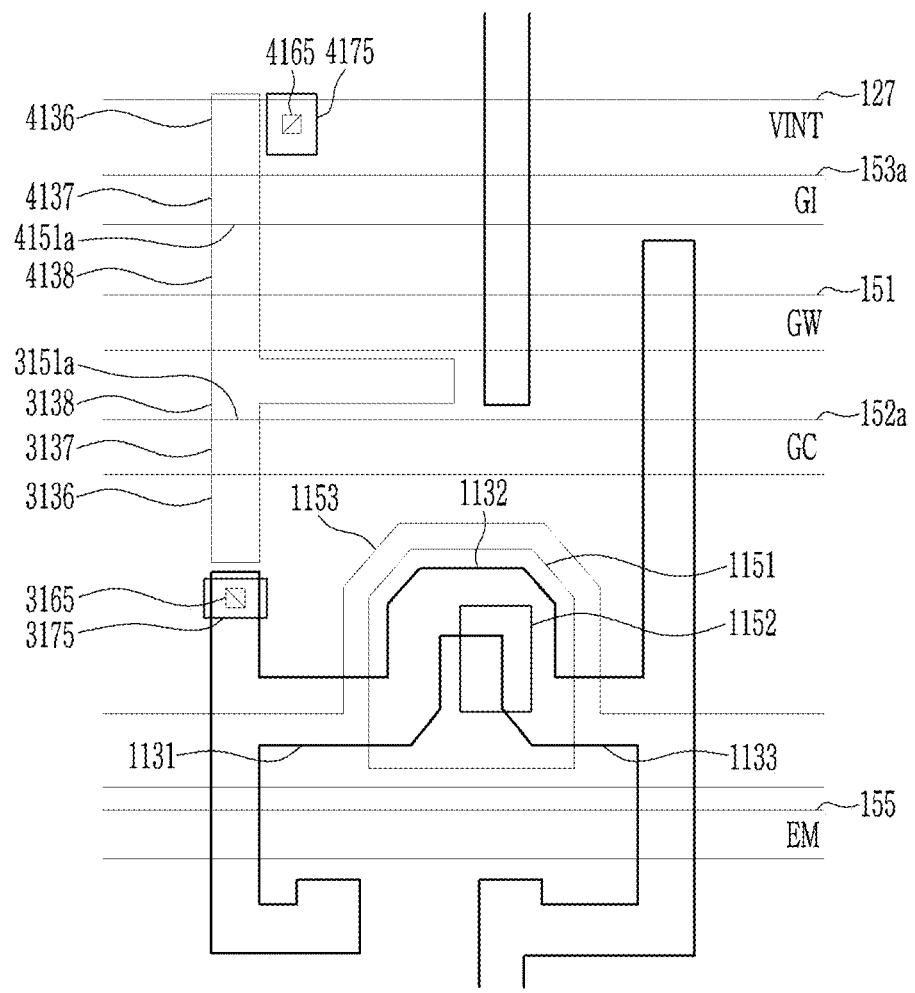
Figure 16:
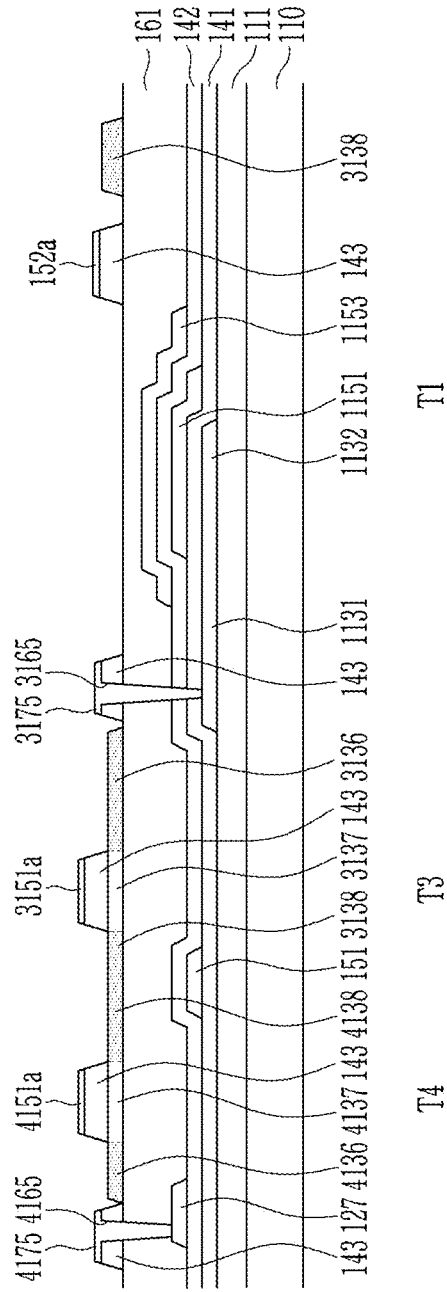

A third gate conductor GAT3 that includes a lower gate electrode 3151a of the third transistor T3 and a lower gate electrode 4151a of the fourth transistor T4 may be disposed on the third gate insulation layer 143. FIG. 15 and FIG. 16 illustrates the polycrystalline semiconductor ACT1 (LTPS), the first gate conductor GAT1, the second gate conductor GAT2, the oxide semiconductor ACT2 (Oxide), and the third gate conductor GAT3. In addition, FIG. 15 and FIG. 16 illustrate an opening CNT1 defined in the third gate insulation layer 143.

The lower gate electrode 3151a of the third transistor T3 may overlap the channel 3137 of the third transistor T3. The lower gate electrode 4151a of the fourth transistor T4 may overlap the channel 4137 of the fourth transistor T4.

The third gate conductor GAT3 may further include a lower second scan line 152a and a lower initialization control line 153a. The lower second scan line 152a and the lower initialization control line 153a may extend approximately in a horizontal direction. The lower second scan line 152a may be connected with the lower gate electrode 3151a of the third transistor T3. The lower second scan line 152a may be unitary with the lower gate electrode 3151a of the third transistor T3. The lower initialization control line 153a may be connected with the lower gate electrode 4151a of the fourth transistor T4. The lower initialization control line 153a may be unitary with the lower gate electrode 4151a of the fourth transistor T4.

The third gate conductor GAT3 may further include a lower first connection electrode 3175 and a lower second connection electrode 4175. The lower first connection electrode 3175 may overlap the first electrode 1131 of the driving transistor T1. The lower first connection electrode 3175 may be disposed to be adjacent to the first electrode 3136 of the third transistor T3. The lower second connection electrode 4175 may overlap the initialization voltage line 127. The lower second connection electrode 4175 may be disposed to be adjacent to the first electrode 4136 of the fourth transistor T4.

The first gate insulation layer 141, the second gate insulation layer 142, and the first interlayer insulation layer 161 may be disposed on an entirety of the substrate 110. The third gate insulation layer 143 is not disposed on an entirety of the substrate 110, but may be disposed only in some regions. The third gate insulation layer 143 may be disposed only under the third gate conductor. The third gate insulation layer 143 may be disposed between the lower gate electrode 3151a of the third transistor T3 and the channel 3137 of the third transistor T3. The third gate insulation layer 143 is not disposed on the first electrode 3136 and the second electrode 3138 of the third transistor T3. The third gate insulation layer 143 may be disposed between the lower gate electrode 4151a of the fourth transistor T4 and the channel 4137 of the fourth transistor T4. The third gate insulation layer 143 is not disposed on the first electrode 4136 and the second electrode 4138 of the fourth transistor T4. The third gate insulation layer 143 may be disposed between the lower second scan line 152a and the lower initialization control line 153a. The third gate insulation layer 143 may be disposed between the lower first connection electrode 3175 and the lower second connection electrode 4175.

A first opening 3165 and a second opening 4165 may be defined in the third gate insulation layer 143. The first opening 3165 may overlap the first electrode 1131 of the driving transistor T1. The first opening 3165 may overlap the lower first connection electrode 3175. The first opening 3165 may be further defined in the first interlayer insulation layer 161, the second gate insulation layer 142, and the first gate insulation layer 141. The lower first connection electrode 3175 may be connected with the first electrode 1131 of the driving transistor T1 through the first opening 3165. The second opening 4165 may overlap the initialization voltage line 127. The second opening 4165 may overlap the lower second connection electrode 4175. The second opening 4165 may be further defined in the first interlayer insulation layer 161. The lower second connection electrode 4175 may be connected with the initialization voltage line 127 through a second opening 4165.

After forming the third gate conductor GAT3 that includes the lower gate electrode 3151a of the third transistor T3 and the lower gate electrode 4151a of the fourth transistor T4, a doping process or plasma treatment may be performed. A portion of the oxide semiconductor ACT2 (Oxide), covered by the third gate conductor GAT3 does not experience the doping process or plasma treatment, and a portion of the oxide semiconductor ACT2 (Oxide), not covered by the third gate conductor GAT3 may be doped or plasma-treated, thereby having the same characteristic as that of a conductor. The channel 3137 of the third transistor T3 may be disposed below the gate electrode 3151 to thereby overlap the gate electrode 3151. The first electrode 3136 and the second electrode 3138 of the third transistor T3 may not overlap the gate electrode 3151. The channel 4137 of the fourth transistor T4 may be disposed below the gate electrode 4151 to as to overlap the gate electrode 4151. The first electrode 4136 and the second electrode 4138 of the fourth transistor T4 may not overlap the gate electrode 4151. In this case, an N-type dopant may be used, and the third transistor T3 and the fourth transistor T4 including an oxide semiconductor material may have an N-type transistor characteristic.

Figure 17:
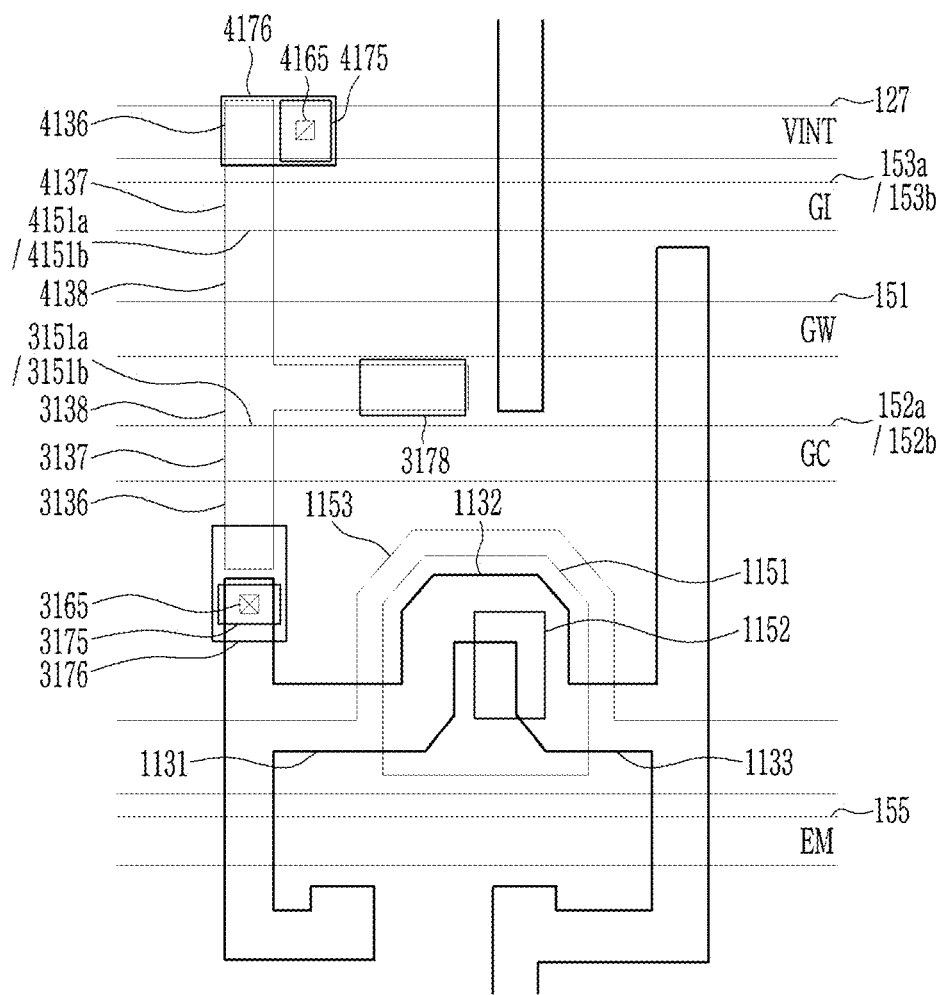
Figure 18:
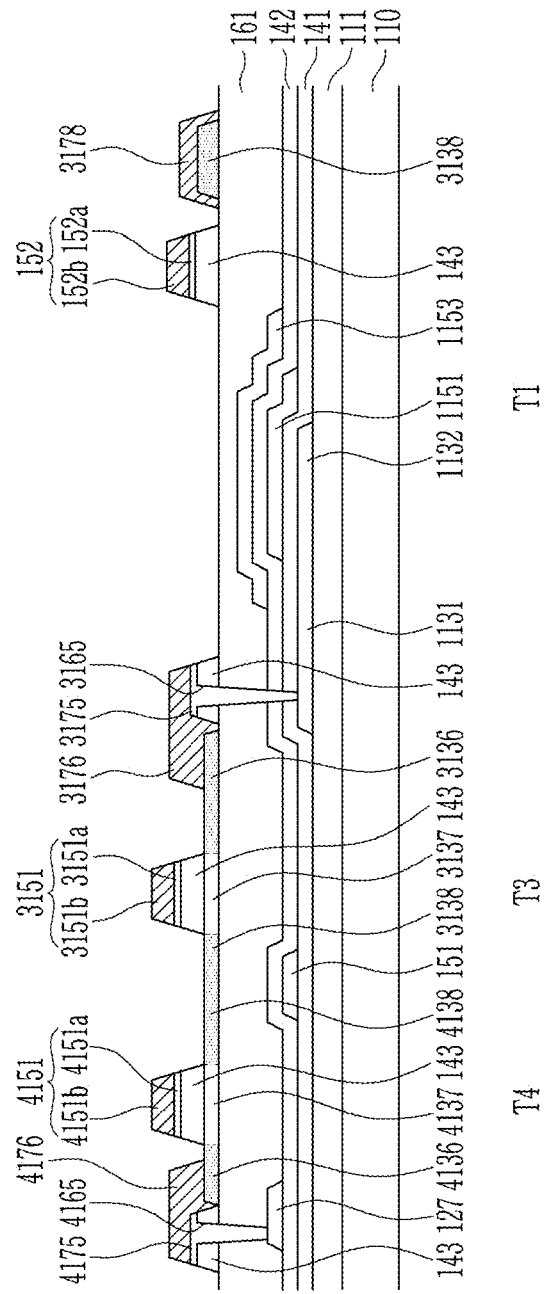

A fourth gate conductor GAT4 that includes an upper gate electrode 3151b of the third transistor T3 and an upper gate electrode 4151b of the fourth transistor T4 may be disposed on the third gate conductor GAT3. FIG. 17 and FIG. 18 illustrate the polycrystalline semiconductor ACT1 (LTPS), the first gate conductor GAT1, the second gate conductor GAT2, the oxide semiconductor ACT2 (Oxide), the opening CNT1, the third gate conductor GAT3, and the fourth gate conductor GAT4.

The fourth gate conductor GAT4 may be disposed above the third gate conductor GAT3. An insulation layer is not disposed between the third gate conductor GAT3 and the fourth gate conductor GAT4. The third gate conductor GAT3 and the fourth gate conductor GAT4 may contact each other.

The upper gate electrode 3151b of the third transistor T3 may be disposed on the lower gate electrode 3151a of the third transistor T3. The upper gate electrode 3151b of the third transistor T3 may be disposed above the lower gate electrode 3151a of the third transistor T3. The upper gate electrode 3151b of the third transistor T3 may contact the lower gate electrode 3151a of the third transistor T3. The upper gate electrode 3151b of the third transistor T3 may have the same shape as that of the lower gate electrode 3151a of the third transistor T3 in a plan view.

The upper gate electrode 4151b of the fourth transistor T4 may be disposed above the lower gate electrode 4151a of the fourth transistor T4. The upper gate electrode 4151b of the fourth transistor T4 may be directly disposed above the lower gate electrode 4151a of the fourth transistor T4. The upper gate electrode 4151b of the fourth transistor T4 may contact the lower gate electrode 4151a of the fourth transistor T4. The upper gate electrode 4151b of the fourth transistor T4 may have the same shape as that of the lower gate electrode 4151a of the fourth transistor T4 in a plan view.

The fourth gate conductor may further include an upper second scan line 152b and an upper initialization control line 153b. The upper second scan line 152b and the upper initialization control line 153b may extend approximately in a horizontal direction. The upper second scan line 152b may be disposed above the lower second scan line 152a. The upper second scan line 152b may be disposed directly above the lower second scan line 152a. The upper second scan line 152b and the lower second scan line 152a may contact each other. The upper second scan line 152b may have the same shape as that of the lower second scan line 152a in a plan view. The upper second scan line 152b may be connected with the upper gate electrode 3151b of the third transistor T3. The upper second scan line 152b may be unitary with the upper gate electrode 3151b of the third transistor T3. The upper initialization control line 153b may be disposed on the lower initialization control line 153a. The upper initialization control line 153b may be disposed directly above the lower initialization control line 153a. The upper initialization control line 153b and the lower initialization control line 153a may contact each other. The upper initialization control line 153b may have the same shape as that of the lower initialization control line 153a in a plan view. The upper initialization control line 153b may be connected with the upper gate electrode 4151b of the fourth transistor T4. The upper initialization control line 153b may be unitary with the upper gate electrode 4151b of the fourth transistor T4.

The fourth gate conductor may further include an upper first connection electrode 3176 and an upper second connection electrode 4176. The upper first connection electrode 3176 may overlap the first electrode 1131 of the driving transistor T1, the lower first connection electrode 3175, and the first electrode 3136 of the third transistor T3. The upper first connection electrode 3176 may be disposed directly above the lower first connection electrode 3175 and the first electrode 3136 of the third transistor T3. The upper first connection electrode 3176 and the lower first connection electrode 3175 may contact each other, and the upper first connection electrode 3176 and the first electrode 3136 of the third transistor T3 may contact each other. The upper first connection electrode 3176 may electrically connect the first electrode 1131 of the driving transistor T1 and the first electrode 3136 of the third transistor T3. The upper second connection electrode 4176 may overlap the initialization voltage line 127, the lower second connection electrode 4175, and the first electrode 4136 of the fourth transistor T4. The upper second connection electrode 4176 may be disposed directly above the lower second connection electrode 4175 and the first electrode 4136 of the fourth transistor T4. The upper second connection electrode 4176 and the lower second connection electrode 4175 may contact each other, and the upper second connection electrode 4176 and the first electrode 4136 of the fourth transistor T4 may contact each other. The upper second connection electrode 4176 may electrically connect the initialization voltage line 127 and the first electrode 4136 of the fourth transistor T4.

The fourth gate conductor may further include a protection pad 3178. The protection pad 3178 may be disposed on the second electrode 3138 of the third transistor T3. The protection pad 3178 may be disposed directly on the second electrode 3138 of the third transistor T3. The protection pad 3178 and the second electrode 3138 of the third transistor T3 may contact each other. The protection pad 3178 may be disposed to cover the top surface and the side surface of the second electrode 3138 of the third transistor T3.

A second interlayer insulation layer 162 may be disposed on the fourth gate conductor GAT4 that includes the upper gate electrode 3151b of the third transistor T3 and the upper gate electrode 4151b of the fourth transistor T4. A third opening 3166 may be defined in the second interlayer insulation layer 162. The third opening 3166 may overlap the protection pad 3178 and the second electrode 3138 of the third transistor T3.

A data conductor SD that includes a third connection electrode 1175 may be disposed on the second interlayer insulation layer 162.

The third connection electrode 1175 may overlap the protection pad 3178 and the second electrode 3138 of the third transistor T3. The third connection electrode 1175 may be connected with the protection pad 3178 through the third opening 3166. The third connection electrode 1175 may be connected with the second electrode 3138 of the third transistor T3 through the protection pad 3178. The third connection electrode 1175 may overlap the gate electrode 1151 of the driving transistor T1. The third connection electrode 1175 may be connected with the gate electrode 1151 of the driving transistor T1. The third connection electrode 1175 may electrically connect the second electrode 3138 of the third transistor T3 and the gate electrode 1151 of the driving transistor T1.

The data conductor SD may further include the data line 171 and the driving voltage line 172. The data line 171 and the driving voltage line 172 may extend approximately in a vertical direction. The data line 171 may be connected with the second transistor T2. The driving voltage line 172 may be connected with the fifth transistor T5. In addition, the driving voltage line 172 may be connected with the first storage electrode 1153.

In the above description, the third connection electrode 1175, the data line 171, and the driving voltage line 172 are disposed in the same layer, and thus form the data conductor SD, but the invention is not limited thereto, and various modifications are available. In an embodiment, the data conductor SD may include the first data conductor and the second data conductor, for example. In this case, an insulation layer may be disposed between the first data conductor and the second data conductor. Some of the third connection electrode 1175, the data line 171, and the driving voltage line 172 may be included in the first data conductor, and a part of the other may be included in the second data conductor.

Although it is not illustrated, a protective film may be disposed on the data conductor SD, and an anode may be disposed on the protective film. The anode may be connected with the sixth transistor T6, and may receive an output current of the driving transistor T1. A partitioning wall may be disposed on the anode. An opening is defined in the partitioning wall, and the opening of the partitioning wall may overlap the anode. A light emission element layer may be disposed in the opening of the partitioning wall. A cathode may be disposed on the light emission element layer and the partitioning wall. The anode, the light emission element layer, and the cathode may form a light emitting diode LED.

Next, referring to FIG. 1 to FIG. 18, a method for manufacturing a display device in an embodiment will be described.

First, as shown in FIG. 5 and FIG. 6, a buffer layer 111 may be provided by an organic insulation material or an inorganic insulation material on a substrate 110. The buffer layer 111 may be disposed on an entirety of the substrate 110. The buffer layer 111 may have a single or multi-layer structure. The buffer layer 111 may be omitted depending on cases.

Subsequently, a polycrystalline semiconductor ACT1 (LTPS) may be provided by a polycrystalline semiconductor material on the buffer layer 111. A channel 1132, a first electrode 1131, and a second electrode 1133 of a driving transistor T1 may be provided by patterning the polycrystalline semiconductor ACT1 (LTPS) through a photo and etching process. In this case, channels, first electrodes, and second electrodes of a second transistor T2, a fifth transistor T5, a sixth transistor T6, and a seventh transistor T7 may be further provided in addition to the driving transistor T1.

As shown in FIG. 7 and FIG. 8, a first gate insulation layer 141 may be provided by a silicon nitride, a silicon oxide, and the like, on the polycrystalline semiconductor ACT1 (LTPS). The first gate insulation layer 141 may be disposed on an entirety of the substrate 110.

Subsequently, a first gate conductor GAT1 may be provided by a metallic material on the first gate insulation layer 141. The first gate conductor GAT1 is patterned through a photo and etching process such that a gate electrode 1151 of the driving transistor T1 may be disposed. In this case, gate electrodes of the second transistor T2, the fifth transistor T5, the sixth transistor T6, and the seventh transistor T7 may be further provided in addition to the gate electrode of the driving transistor T1. In addition, a first scan line 151 and a light emission control line 155 may be provided.

The gate electrode 1151 of the driving transistor T1 may be patterned to overlap the channel 1132 of the driving transistor T1. In this case, the gate electrode 1151 of the driving transistor T1 may be patterned so that it does not overlap with the first electrode 1131 and the second electrode 1133 of the driving transistor T1. The first scan line 151 may be patterned to be connected to the gate electrode of the second transistor T2. The light emission control line 155 may be patterned to be connected to the gate electrode of the fifth transistor T5 and the gate electrode of the sixth transistor T6.

After patterning the first gate conductor GAT1, a doping or plasma treatment is performed to adjust electrical conductivity of the polycrystalline semiconductor ACT1 (LTPS). When a doping process or a plasma treatment is performed on an entirety of the substrate 110, a portion of the polycrystalline semiconductor ACT1 (LTPS) covered by the first gate conductor GAT1 is not doped or plasma-treated, and a portion of the polycrystalline semiconductor ACT1 (LTPS) not covered by the first gate conductor GAT1 is doped or plasma-treated and thus may have the same characteristic as that of a conductor. Thus, the first electrode 1131 and the second electrode 1133 of the driving transistor T1 may have the same characteristic as that of a conductor. In this case, a P-type dopant may be used, and the driving transistor T1, the second transistor T2, the fifth transistor T5, the sixth transistor T6, and the seventh transistor T7 that include a polycrystalline semiconductor material may have a P-type transistor characteristic.

As shown in FIG. 9 and FIG. 10, a second gate insulation layer 142 may be provided by a silicon nitride, a silicon oxide, and the like on the first gate conductor GAT1 and the first gate insulation layer 141. In this case, the second gate insulation layer 142 may be disposed on an entirety of the substrate 110.

Subsequently, a second gate conductor GAT2 may be provided by a metallic material on the second gate insulation layer 142. A first storage electrode 1153 of the storage capacitor Cst may be provided by patterning the second gate conductor GAT2 through a photo and etching process. In this case, an initialization voltage line 127 may be further provided.

The first storage electrode 1153 of the storage capacitor Cst forms the storage capacitor Cst by overlapping the gate electrode 1151 of the driving transistor T1. The initialization voltage line 127 may extend approximately in a horizontal direction.

As shown in FIG. 11 and FIG. 12, a first interlayer insulation layer 161 may be provided by a silicon nitride, a silicon oxide, and the like on the second gate conductor GAT2 and the second gate insulation layer 142. In this case, the first interlayer insulation layer 161 may be disposed on an entirety of the substrate 110.

Subsequently, an oxide semiconductor ACT2 (Oxide) may be provided by an oxide semiconductor material on the first interlayer insulation layer 161. A channel 3137, a first electrode 3136, and a second electrode 3138 of the third transistor T3 and a channel 4137, a first electrode 4136, and a second electrode 4138 of the fourth transistor T4 may be provided by patterning the oxide semiconductor ACT2(Oxide) through a photo and etching process.

The channel 3137, the first electrode 3136, and the second electrode 3138 of the third transistor T3 and the channel 4137, the first electrode 4136, and the second electrode 4138 of the fourth transistor T4 may be connected with each other and thus may be unitary.

Figure 13:
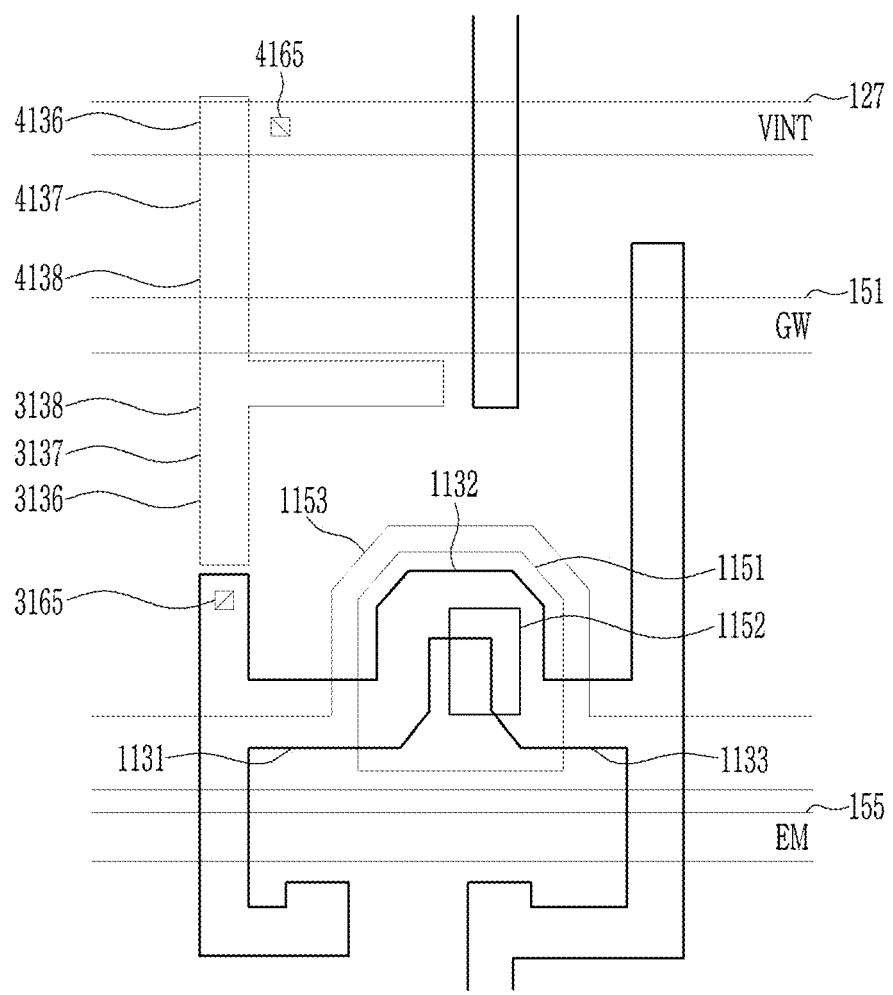
Figure 14:
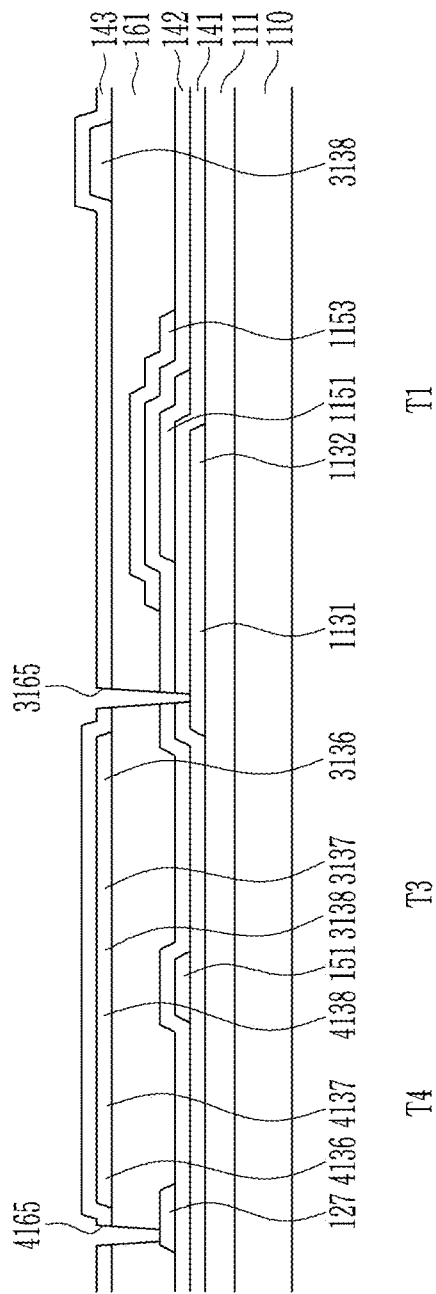

As shown in FIG. 13 and FIG. 14, a third gate insulation layer 143 may be provided by a silicon nitride, a silicon oxide, and the like on the oxide semiconductor ACT2 (Oxide) and the first interlayer insulation layer 161. In this case, the third gate insulation layer 143 may be disposed on an entirety of the substrate 110.

Subsequently, an opening CNT1 may be defined by patterning the third gate insulation layer 143 through a photo and etching process. In this case, a first interlayer insulation layer 161, a second gate insulation layer 142, and a first gate insulation layer 141, which are disposed below the third gate insulation layer 143, may also be patterned together. A first opening 3165 and a second opening 4165 may be defined in the third gate insulation layer 143. The first opening 3165 may be defined in the third gate insulation layer 143, the first interlayer insulation layer 161, the second gate insulation layer 142, and the first gate insulation layer 141. At least a part of the top surface of the first electrode 1131 of the driving transistor T1 may be exposed to the outside by the first opening 3165. That is, the first opening 3165 may overlap at least a part of the first electrode 1131 of the driving transistor T1. The second opening 4165 may be defined in the third gate insulation layer 143 and the first interlayer insulation layer 161. At least a part of the top surface of the initialization voltage line 127 may be exposed to the outside by the second opening 4165. That is, the second opening 4165 may overlap at least a part of the initialization voltage line 127.

While an etching process for defining the first opening 3165 and the second opening 4165 is carried out, the channel 3137, the first electrode 3136, and the second electrode 3138 of the third transistor T3 and the channel 4137, the first electrode 4136, and the second electrode 4138 of the fourth transistor T4, which include an oxide semiconductor material, are covered by the third gate insulation layer 143. Thus, the channel 3137, the first electrode 3136, and the second electrode 3138 of the third transistor T3 and the channel 4137, the first electrode 4136, and the second electrode 4138 of the fourth transistor T4 may be prevented from being damaged due to the etching process.

As shown in FIG. 15 and FIG. 16, a third gate conductor GAT3 may be disposed on the third gate insulation layer 143 by a metallic material. A lower gate electrode 3151a of the third transistor T3 and a lower gate electrode 4151a of the fourth transistor T4 may be provided by patterning the third gate conductor GAT3 through a photo and etching process. In this case, a lower second scan line 152a and a lower initialization control line 153a may be further provided. In addition, a lower first connection electrode 3175 and a lower second connection electrode 4175 may be further provided.

The lower gate electrode 3151a of the third transistor T3 may overlap the channel 3137 of the third transistor T3. The lower gate electrode 4151a of the fourth transistor T4 may overlap the channel 4137 of the fourth transistor T4. The lower second scan line 152a and the lower initialization control line 153a may extend approximately in a horizontal direction. The lower second scan line 152a may be connected with the lower gate electrode 3151a of the third transistor T3. The lower initialization control line 153a may be connected with the lower gate electrode 4151a of the fourth transistor T4. The lower first connection electrode 3175 may be connected with the first electrode 1131 of the driving transistor T1 through the first opening 3165. The lower second connection electrode 4175 may be connected with the initialization voltage line 127 through the second opening 4165.

Subsequently, the third gate insulation layer 143 may be patterned through an etching process using the third gate conductor GAT3 as a mask. A portion of the third gate insulation layer 143, covered by the third gate conductor GAT3, remains, and a portion of the third gate insulation layer 143, not covered by the third gate conductor GAT3, is removed. Thus, portions of the third gate insulation layer 143, disposed below the lower gate electrode 3151a of the third transistor T3, the lower gate electrode 4151a of the fourth transistor T4, the lower second scan line 152a, the lower initialization control line 153a, the lower first connection electrode 3175, and the lower second connection electrode 4175, remain. Portions of the third gate insulation layer 143, disposed above the first electrode 3136 and the second electrode 3138 of the third transistor T3 and the first electrode 4136 and the second electrode 4138 of the fourth transistor T4 are removed.

After patterning the third gate conductor GAT3, a doping or plasma treatment is performed such that electrical conductivity of the oxide semiconductor ACT2 (Oxide) may be adjusted. When the doping process or the plasma treatment is performed throughout the substrate 110, a portion of the oxide semiconductor ACT2 (Oxide) covered by the third gate conductor GAT3 is not doped or plasma-treated, and a portion of the oxide semiconductor ACT2 (Oxide) not covered by the third gate conductor GAT3 is doped or plasma-treated such that the portion has the same characteristic as that of a conductor. Thus, the first electrode 3136 and the second electrode 3138 of the third transistor T3 and the first electrode 4136 and the second electrode 4138 of the fourth transistor T4 may have the same characteristic as that of a conductor. In this case, an N-type dopant may be used, and the third transistor T3 and the fourth transistor T4 that include the oxide semiconductor material may have an N-type transistor characteristic.

As shown in FIG. 17 and FIG. 18, a fourth gate conductor GAT4 may be disposed on the third gate conductor GAT3, the oxide semiconductor ACT2 (Oxide), and the first interlayer insulation layer 161 by a metallic material. The fourth gate conductor GAT4 is disposed directly above the third gate conductor GAT3, the oxide semiconductor ACT2 (Oxide) and the first interlayer insulation layer 161. Thus, the fourth gate conductor GAT4 may contact the third gate conductor GAT3, and the fourth gate conductor GAT4 may contact the oxide semiconductor ACT2 (Oxide). The fourth gate conductor GAT4 is patterned through a photo and etching process and thus the upper gate electrode 3151b of the third transistor T3 and the upper gate electrode 4151b of the fourth transistor T4 may be provided. In this case, an upper second scan line 152b and an upper initialization control line 153b may be further provided. In addition, an upper first connection electrode 3176, an upper second connection electrode 4176, and a protection pad 3178 may be further provided.

The upper gate electrode 3151b of the third transistor T3 may be disposed on the lower gate electrode 3151a of the third transistor T3. The upper gate electrode 3151b of the third transistor T3 may have the same shape as that of the lower gate electrode 3151a of the third transistor T3 in a plan view. The upper gate electrode 4151b of the fourth transistor T4 may be disposed on the lower gate electrode 4151a of the fourth transistor T4. The upper gate electrode 4151b of the fourth transistor T4 may have the same shape as that of the lower gate electrode 4151a of the fourth transistor T4.

The upper second scan line 152b and the upper initialization control line 153b may extend approximately in a horizontal direction. The upper second scan line 152b may be disposed on the lower second scan line 152a, and may be connected with the upper gate electrode 3151b of the third transistor T3. The upper second scan line 152b may have the same shape as that of the lower second scan line 152a in a plan view. The upper initialization control line 153b may be disposed on the lower initialization control line 153a, and may be connected with the upper gate electrode 4151b of the fourth transistor T4. The upper initialization control line 153b may have the same shape as that of the lower initialization control line 153a in a plan view.

The upper first connection electrode 3176 may be disposed on the lower first connection electrode 3175 and the first electrode 3136 of the third transistor T3. The upper first connection electrode 3176 may electrically connect the first electrode 1131 of the driving transistor T1 with the first electrode 3136 of the third transistor T3. In this case, the upper first connection electrode 3176 and the first electrode 1131 of the driving transistor T1 may be connected through the lower first connection electrode 3175, and the lower first connection electrode 3175 may be connected with the first electrode 1131 of the driving transistor T1 through the first opening 3165. In addition, the upper first connection electrode 3176 may be directly connected with the first electrode 3136 of the third transistor T3.

The upper second connection electrode 4176 may be disposed on the lower second connection electrode 4175 and the first electrode 4136 of the fourth transistor T4. The upper second connection electrode 4176 may electrically connect the initialization voltage line 127 and the first electrode 4136 of the fourth transistor T4. In this case, the upper second connection electrode 4176 and the initialization voltage line 127 may be connected through the lower second connection electrode 4175, and the lower second connection electrode 4175 may be connected with the initialization voltage line 127 through the second opening 4165. In addition, the upper second connection electrode 4176 may be directly connected with the first electrode 4136 of the fourth transistor T4.

When a transistor including a polycrystalline semiconductor material and a transistor that includes an oxide semiconductor material are connected through a connection electrode, one opening is defined for connection with the connection electrode and the transistor including the polycrystalline semiconductor material, and another opening may be further defined for connection with the connection electrode and the transistor including the oxide semiconductor material. In this case, by increasing the number of openings, the distance between the electrodes may increase, and accordingly, the size of each pixel may increase. In the illustrated embodiment, one opening connects the connection electrode and the transistor including the polycrystalline semiconductor material, and the connection electrode and the transistor including an oxide semiconductor material are directly connected, thereby reducing the number of openings. Accordingly, a distance between electrodes may be reduced, the size of each pixel may be reduced, and a high resolution display device may be implemented.

In addition, in the illustrated embodiment, the third gate conductor GAT3 is provided first and then the fourth gate conductor GAT4 is disposed thereon and thus the first electrode 3136 and the second electrode 3138 of the third transistor T3 and the first electrode 4136 and the second electrode 4138 of the fourth transistor T4 may be prevented from being damaged. As a comparative example, when the third gate conductor GAT3 and the fourth gate conductor GAT4 are unitary with one pattern, a process for defining the opening CNT1 and a process for exposing a part of the oxide semiconductor ACT2 (Oxide) may be simultaneously performed. In this case, the oxide semiconductor ACT2 (Oxide) may be damaged due to an etching solution used to form the opening CNT1. In the illustrated embodiment, a process for defining the opening CNT1 and a process for exposing a part of the oxide semiconductor ACT2 (Oxide) are separately performed, thereby preventing the oxide semiconductor ACT2 (Oxide) from being damaged. In this case, the third gate conductor GAT3 and the fourth gate conductor GAT4 may include the same metallic material, or may include different metallic materials.

The protection pad 3178 may be disposed on the second electrode 3138 of the third transistor T3. The protection pad 3178 may serve to protect the second electrode 3138 of the third transistor T3 in a subsequent process.

As shown in FIG. 2 and FIG. 3, the second interlayer insulation layer 162 may be disposed on the fourth gate conductor GAT4, the oxide semiconductor ACT2 (Oxide), and the first interlayer insulation layer 161 by a silicon nitride, a silicon oxide, and the like. In this case, the second interlayer insulation layer 162 may be disposed on an entirety of the substrate 110. The second interlayer insulation layer 162 may not be in contact with the upper surface of the third gate insulation layer 143. The second interlayer insulation layer 162 may contact the side surface of the third gate insulation layer 143.

Subsequently, the second interlayer insulation layer 162 is patterned to form an opening CNT2 through a photo and etching process. A third opening 3166 may be defined in the second interlayer insulation layer 162. At least part of the top surface of the protection pad 3178 may be exposed to the outside by the third opening 3166. That is, the third opening 3166 may at least partially overlap the protection pad 3178.

In this case, a buffered oxide etchant ("BOE") may be used. The BOE is a chemical combination of ammonium fluoride (NH$_4$F) and hydrofluoric acid ("HF"), and may be used in etching of silicon dioxide. During etching, hydrogen fluoride is directly involved in oxide etching, and ammonium fluoride may be act as a buffer solution that improves uniformity by adjusting the etching ratio. The BOE may be used in cleaning processes, such as removing organic materials from the upper surface of the substrate, and may be a part of a metal etching solution. When the oxide semiconductor is exposed in the process of defining the opening CNT2, the oxide semiconductor may be damaged by the BOE. In the illustrated embodiment, since the protection pad 3178 is disposed on the second electrode 3138 of the third transistor T3 including the oxide semiconductor material, damage to the second electrode 3138 of the third transistor T3 may be prevented in the process of defining the third opening 3166.

Subsequently, the data conductor SD may be disposed on the second interlayer insulation layer 162 by a metallic material. The third connection electrode 1175 may be provided by patterning the data conductor SD through a photo and etching process. In this case, the data line 171 and the driving voltage line 172 may be further provided.

The third connection electrode 1175 may be connected to the protection pad 3178 through the third opening 3166. The third connection electrode 1175 may be connected to the second electrode 3138 of the third transistor T3 through the protection pad 3178. The third connection electrode 1175 may be connected to the gate electrode 1151 of the driving transistor T1. The third connection electrode 1175 may be electrically connected to the second electrode 3138 of the third transistor T3 and the gate electrode 1151 of the driving transistor T1. The data line 171 and the driving voltage line 172 may extend approximately in a vertical direction.

In the above description, an operation for forming the data conductor SD on the second interlayer insulation layer 162 is described, but the invention is not limited thereto, and various modifications are available. In an embodiment, the first data conductor may be disposed on the second interlayer insulation layer 162 and then patterned, an insulation layer may be disposed on the first data conductor, and the second data conductor may be disposed on the insulation layer and then patterned, for example. In this case, a part of the third connection electrode 1175, the data line 171, and the driving voltage line 172 may be included in the first data conductor, and a part of the rest may be included in the second data conductor.

Although it is not illustrated, a protective layer may be disposed on the data conductor SD and the second interlayer insulation layer 162. An anode may be disposed on the protective layer by a metal or a metallic oxide. The anode may be connected with the sixth transistor T6, and may receive an output current of the driving transistor T1. A partitioning wall may be disposed on the anode and the protective layer. An opening may expose the anode by patterning the partitioning wall, and a light emission element layer may be disposed in the opening of the partitioning wall. A cathode may be disposed on the light emission element layer and the partitioning wall. The anode, the light emission element layer, and the cathode may form a light emitting diode LED.

Next, referring to FIG. 19, a display device in an embodiment will be described.

Figure 19:
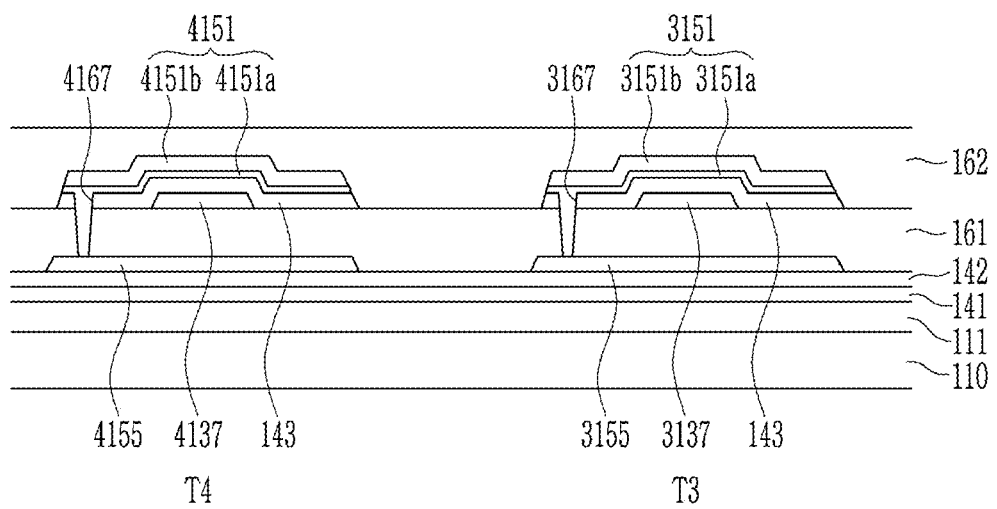
FIG. 19 is a cross-sectional view of an embodiment of a display device.

A display device in an embodiment shown in FIG. 19 is substantially the same as the display device in the embodiment shown in FIG. 1 to FIG. 18, and therefore, description of the same parts will be omitted. Unlike the previously described embodiment, in the embodiment, third and fourth transistors include dual gate electrodes, and this difference will be described in detail hereinafter.

FIG. 19 is a cross-sectional view of an embodiment of a display device. FIG. 19 shows a partial region of a third transistor and a fourth transistor.

As in the above-described embodiment, a pixel PX of a display device in the illustrated embodiment includes a plurality of transistors T1, T2, T3, T4, T5, T6, and T7 connected to a plurality of wires, a storage capacitor Cst, and a light emitting diode LED.

Among the plurality of transistors, a third transistor T3 may include a channel 3137, a first electrode 3136, a second electrode 3138, a lower gate electrode 3151*a*, and an upper gate electrode 3151*b*. In the illustrated embodiment, the third transistor T3 may further include a light blocking layer 3155. The light blocking layer 3155 of the third transistor T3 may overlap the channel 3137, and a gate electrode 3135 of the third transistor T3. A voltage applied to the gate electrode 3151 may be the same as a voltage applied to the light blocking layer 3155. Thus, the third transistor may include a dual gate electrode. In this case, the gate electrode 3151 may be connected with the light blocking layer 3155. An opening 3167 that overlaps the gate electrode 3151 and the light blocking layer 3155 may be defined in the third gate insulation layer 143. The lower gate electrode 3151 may be connected with the light blocking layer 3155 through the opening 3167.

The fourth transistor T4 may include a channel 4137, a first electrode 4136, a second electrode 4138, a lower gate electrode 4151a, and an upper gate electrode 4151b. In the illustrated embodiment, the fourth transistor T4 may further include a light blocking layer 4155. The light blocking layer 4155 of the fourth transistor T4 may overlap the channel 4137 and a gate electrode 4151 of the fourth transistor T4. A voltage applied to the gate electrode 4151 may be the same as a voltage applied to the light blocking layer 4155. Thus, the fourth transistor T4 may include a dual gate electrode. In this case, the gate electrode 4151 may be connected with the light blocking layer 4155. An opening 4167 that overlaps the gate electrode 4151 and the light blocking layer 4155 may be defined in the third gate insulation layer 143. The lower gate electrode 4151 may be connected with the light blocking layer 4155 through the opening 4167.

As a comparative example, when a gate electrode and a light blocking layer are connected through a connection electrode, an opening connects the gate electrode and the connection electrode, and another opening may connect the light blocking layer and the connection electrode. In this case, by increasing the number of openings, the distance between the electrodes may increase, and accordingly, the size of each pixel may increase. In the illustrated embodiment, one opening directly connects the gate electrode and the light blocking layer, thereby reducing the number of openings. Accordingly, a distance between electrodes may be reduced, the size of each pixel may be reduced, and a high resolution display device may be implemented.

Next, a display device in an embodiment and a method for manufacturing the display device will be described with reference to FIG. 20 to FIG. 25.

A display device in an embodiment of FIG. 20 to FIG. 25 is substantially the same as the display device in the embodiment of FIG. 1 to FIG. 18, and therefore, the same portions will not be described. The illustrated embodiment is different from the above-described embodiment in that a second gate conductor and an oxide semiconductor are unitary, and this will be described in detail hereinafter.

Figure 20:
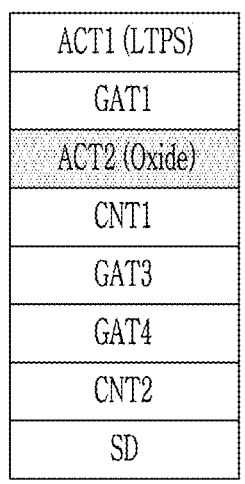
FIG. 20 shows a manufacturing an embodiment of sequence of each layer of a display device.

FIG. 20 shows a manufacturing an embodiment of sequence of each layer of a display device. FIG. 21 to FIG. 25 are cross-sectional views that sequentially illustrate an embodiment of the manufacturing sequence of the display device.

As shown in FIG. 20, a polycrystalline semiconductor ACT1 (LTPS), a first gate conductor GAT1, and an oxide semiconductor ACT2 (Oxide) are provided, and then an opening CNT1 may be defined in an insulation layer. Subsequently, a third gate conductor GAT3 and a fourth gate conductor GAT4 are provided, and then an opening CNT2 may be defined. Subsequently, a data conductor SD may be provided. In the above-described embodiment, the second gate conductor GAT2 is provided before forming the oxide semiconductor ACT2 (Oxide), and in the illustrated embodiment, the second gate conductor GAT2 is omitted. Wires included in the second gate conductor GAT2 in the above-described embodiment may be included in the oxide semiconductor ACT2 (Oxide).

Figure 21:
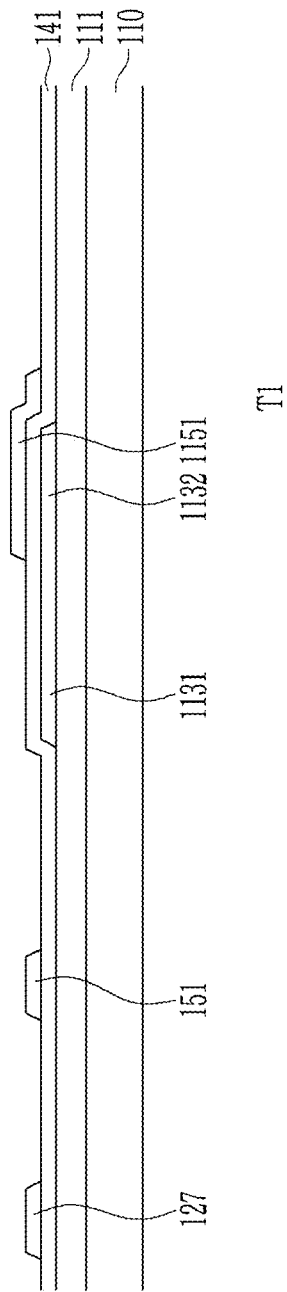
FIG. 21 to FIG. 25 are cross-sectional views that sequentially illustrate an embodiment of the manufacturing sequence of the display device.

As shown in FIG. 21, as in the above-described embodiment, a buffer layer 111 is disposed on a substrate 110, and a polycrystalline semiconductor ACT1 (LTPS) may be disposed on the buffer layer 111. A channel 1132, a first electrode 1131, and a second electrode 1133 of a driving transistor T1 may be provided by patterning the polycrystalline semiconductor ACT1 (LTPS). A first gate insulation layer 141 may be disposed on the polycrystalline semiconductor ACT1 (LTPS).

Subsequently, a first gate conductor GAT1 may be disposed on the first gate insulation layer 141. A gate electrode 1151, a first scan line 151, and the driving transistor T1 may be provided by patterning the first gate conductor GAT1. In this case, an initialization voltage line 127 may be further provided. The initialization voltage line 127 is included in the second gate conductor GAT2 in the above-described embodiment, and the initialization voltage line 127 may be included in the first gate conductor GAT1 in the illustrated embodiment. After patterning the first gate conductor GAT1, a doping process or a plasma treatment may be carried out.

Figure 22:
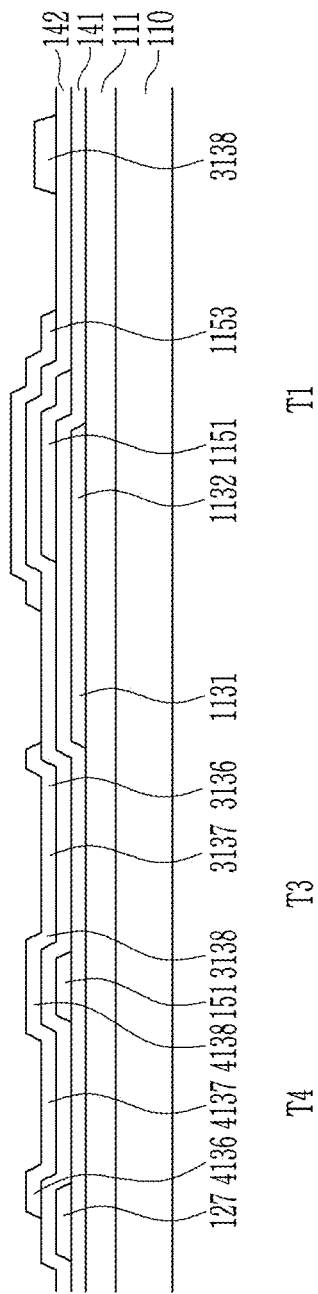

As shown in FIG. 22, a second gate insulation layer 142 may be disposed on the first gate conductor GAT1 and the first gate insulation layer 141.

Subsequently, an oxide semiconductor ACT2 (Oxide) may be disposed on the second gate insulation layer 142. A channel 3137, a first electrode 3136, and a second electrode 3138 of a third transistor T3 and a channel 4137, a first electrode 4136, and a second electrode 4138 of a fourth transistor T4 may be provided by patterning the oxide semiconductor ACT2 (Oxide). In this case, a first storage electrode 1153 may be further provided.

Figure 23:
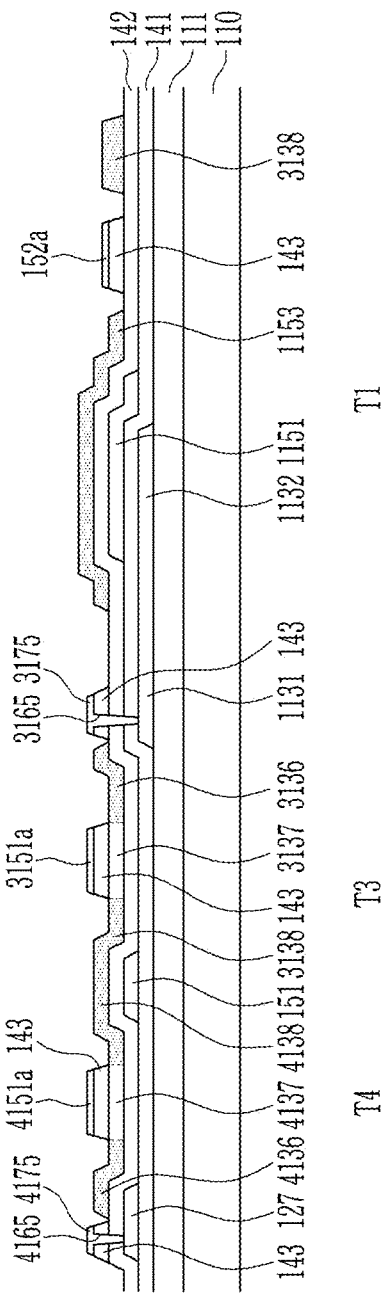

As shown in FIG. 23, a third gate insulation layer 143 may be disposed on an oxide semiconductor ACT2 (Oxide) and a second gate insulation layer 142. Subsequently, an opening CNT1 may be defined by patterning the third gate insulation layer 143. A first opening 3165 and a second opening 4165 may be defined in the third gate insulation layer 143. The first opening 3165 may be defined in the third gate insulation layer 143, the second gate insulation layer 142, and the first gate insulation layer 141. The first opening 3165 may overlap at least a part of the first electrode 1131 of the driving transistor T1. The second opening 4165 may be defined in the third gate insulation layer 143 and the second gate insulation layer 142. The second opening 4165 may overlap at least a part of the initialization voltage line 127.

While an etching process for defining the first opening 3165 and the second opening 4165 is being carried out, the channel 3137, the first electrode 3136, and the second electrode 3138 of the third transistor T3 and the channel 4137, the first electrode 4136, and the second electrode 4138 of the fourth transistor T4 that include an oxide semiconductor material are covered by the third gate insulation layer 143. Thus, the channel 3137, the first electrode 3136, and the second electrode 3138 of the third transistor T3 and the channel 4137, the first electrode 4136, and the second electrode 4138 of the fourth transistor T4 may be prevented from being damaged due to the etching process.

Subsequently, a third gate conductor GAT3 may be disposed on the third gate insulation layer 143. A lower gate electrode 3151a of the third transistor T3, a lower gate electrode 4151a of the fourth transistor T4, a lower second scan line 152a, a lower first connection electrode 3175, a lower second connection electrode 4175, and the like may be provided by patterning the third gate conductor GAT3. The third gate insulation layer 143 may be patterned through an etching process by the third gate conductor GAT3 as a mask. A portion of the third gate insulation layer 143 that is covered by the third gate conductor GAT3 remains, and a portion of the third gate insulation layer 143 not covered by the third gate conductor GAT3 is removed.

After patterning the third gate conductor GAT3, a doping process or a plasma treatment may be carried out. The first electrode 3136 and the second electrode 3138 of the third transistor T3 and the first electrode 4136 and the second electrode 4138 of the fourth transistor T4 may have the same characteristic as that of a conductor. In addition, a first storage electrode 1153 has the same characteristic as that of a conductor.

Figure 24:
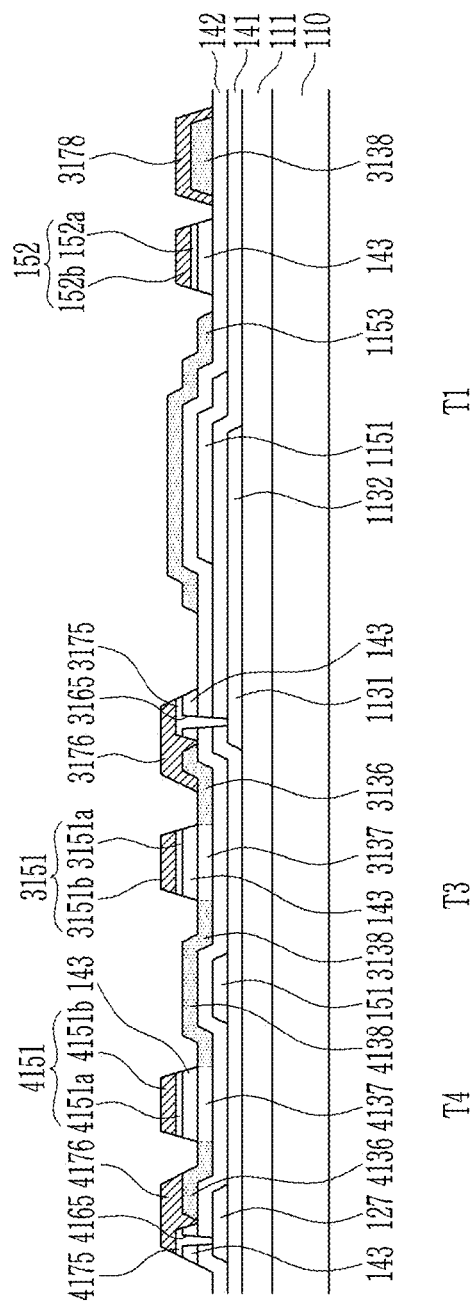

As shown in FIG. 24, a fourth gate conductor GAT4 may be disposed on the third gate conductor GAT3, the oxide semiconductor ACT2 (Oxide), and the second gate insulation layer 142. The fourth gate conductor GAT4 is disposed directly above the third gate conductor GAT3, the oxide semiconductor ACT2 (Oxide), and the second gate insulation layer 142. Thus, the fourth gate conductor GAT4 may contact the third gate conductor GAT3, and the fourth gate conductor GAT4 may contact the oxide semiconductor ACT2 (Oxide). An upper gate electrode 3151b of the third transistor T3, an upper gate electrode 4151b of the fourth transistor T4, an upper second scan line 152b, an upper first connection electrode 3176, an upper second connection electrode 4176, and a protection pad 3178 may be provided by patterning the fourth gate conductor GAT4.

The upper first connection electrode 3176 may electrically connect the first electrode 1131 of the driving transistor T1 and the first electrode 3136 of the third transistor T3. The upper second connection electrode 4176 may electrically connect the initialization voltage line 127 with the first electrode 4136 of the fourth transistor T4.

In the illustrated embodiment, one opening connects a connection electrode and a transistor including a polycrystalline semiconductor material, and the connection electrode and the transistor that includes the oxide semiconductor material are directly connected, thereby reducing the number of openings. Accordingly, a distance between electrodes may be reduced, the size of each pixel may be reduced, and a high resolution display device may be implemented.

In the illustrated embodiment, a process for defining the opening CNT1 and a process for exposing a part of the oxide semiconductor ACT2 (Oxide) are separately performed, thereby preventing the oxide semiconductor ACT2 (Oxide) from being damaged. In this case, the third gate conductor GAT3 and the fourth gate conductor GAT4 may include the same metallic material, or may include different metallic materials.

Figure 25:
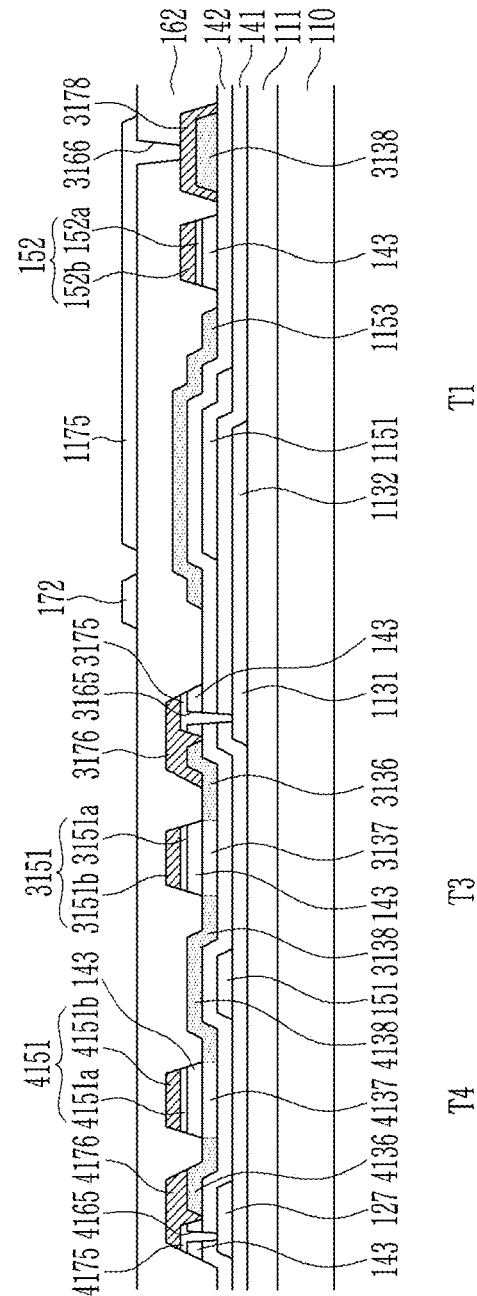

As shown in FIG. 25, a second interlayer insulation layer 162 may be disposed on the fourth gate conductor GAT4, the oxide semiconductor ACT2 (Oxide), and the second gate insulation layer 142. The second interlayer insulation layer 162 may not contact the top surface of the third gate insulation layer 143. The second interlayer insulation layer 162 may contact the side surface of the third gate insulation layer 143.

Subsequently, an opening CNT2 may be defined by patterning the second interlayer insulation layer 162. A third opening 3166 may be defined in the second interlayer insulation layer 162. The third opening 3166 may overlap at least a part of the protection pad 3178.

In this case, a BOE may be used. In the illustrated embodiment, the protection pad 3178 is disposed on the second electrode 3138 of the third transistor T3 that includes an oxide semiconductor material, and thus the second electrode 3138 of the third transistor T3 may be prevented from being damaged during a process for defining the third opening 3166.

Subsequently, a data conductor SD may be disposed on the second interlayer insulation layer 162. A third connection electrode 1175, a data line 171, and a driving voltage line 172 may be provided by patterning the data conductor SD. The third connection electrode 1175 may electrically connect the second electrode 3138 of the third transistor T3 and the gate electrode 1151 of the driving transistor T1.

In the above-description, an operation for forming the data conductor SD on the second interlayer insulation layer 162 has been described, but the invention is not limited thereto, and various modifications are possible. In an embodiment, a first data conductor is disposed on the second interlayer insulation layer 162 and then patterned, an insulation layer is disposed on the first data conductor, and a second data conductor is disposed on the insulation layer and then patterned, for example. In this case, some of the third connection electrode 1175, the data line 171, and the driving voltage line 172 may be included in the first data conductor, and some of the rest may be included in the second data conductor.

Although it is not illustrated, a protection layer may be disposed on the data conductor SD and the second interlayer insulation layer 162. An anode may be disposed on the protection layer by a metal or a metallic oxide. The anode may be connected with a sixth transistor T6, and may receive an output current of the driving transistor T1. A partitioning wall may be disposed on the anode and the protection layer. An opening exposes the anode by patterning the partitioning wall, and a light emission element layer may be disposed in the opening of the partitioning wall. A cathode may be disposed on the light emission element layer and the partitioning wall. The anode, the light emission element layer, and the cathode may form a light emitting diode LED.

Next, a display device in an embodiment and a method for manufacturing the same will be described with reference to FIG. 26 and FIG. 27.

Figure 26:
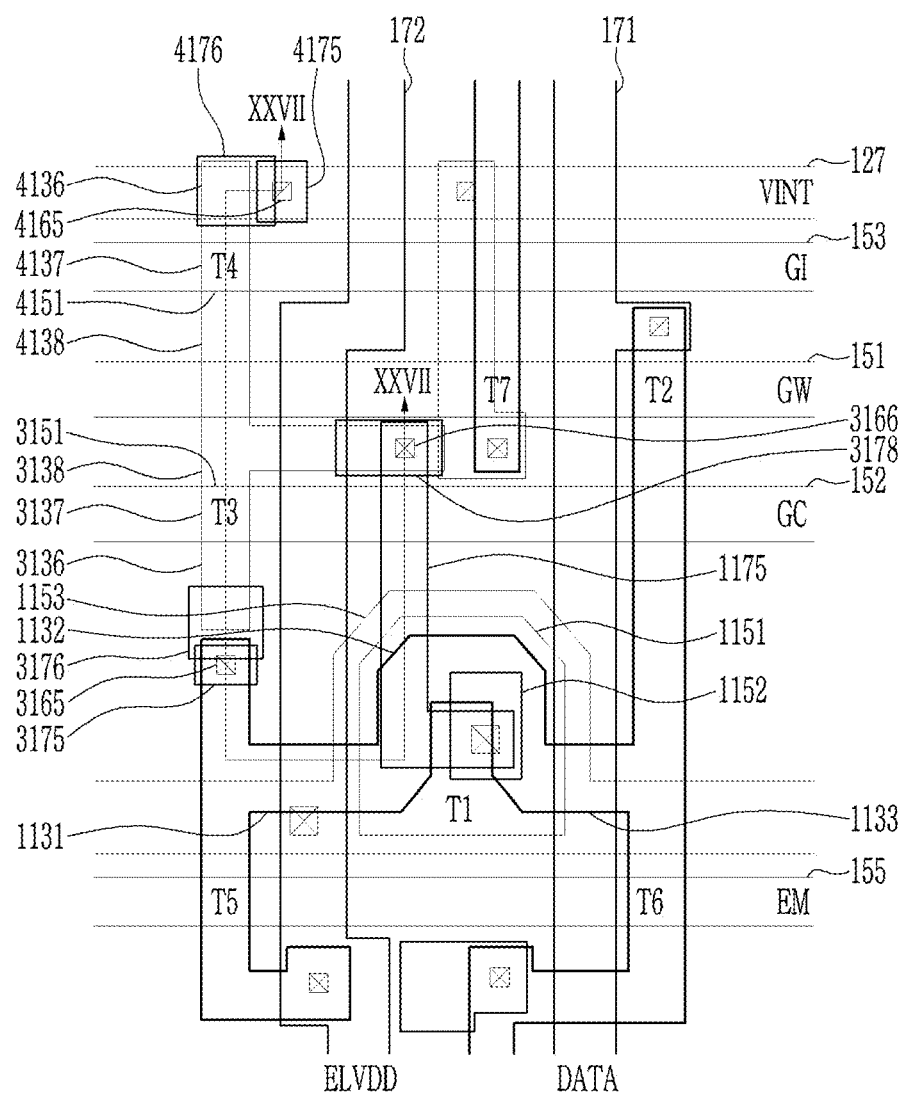
FIG. 26 is a top plan view of an embodiment of a pixel of a display device.
Figure 27:
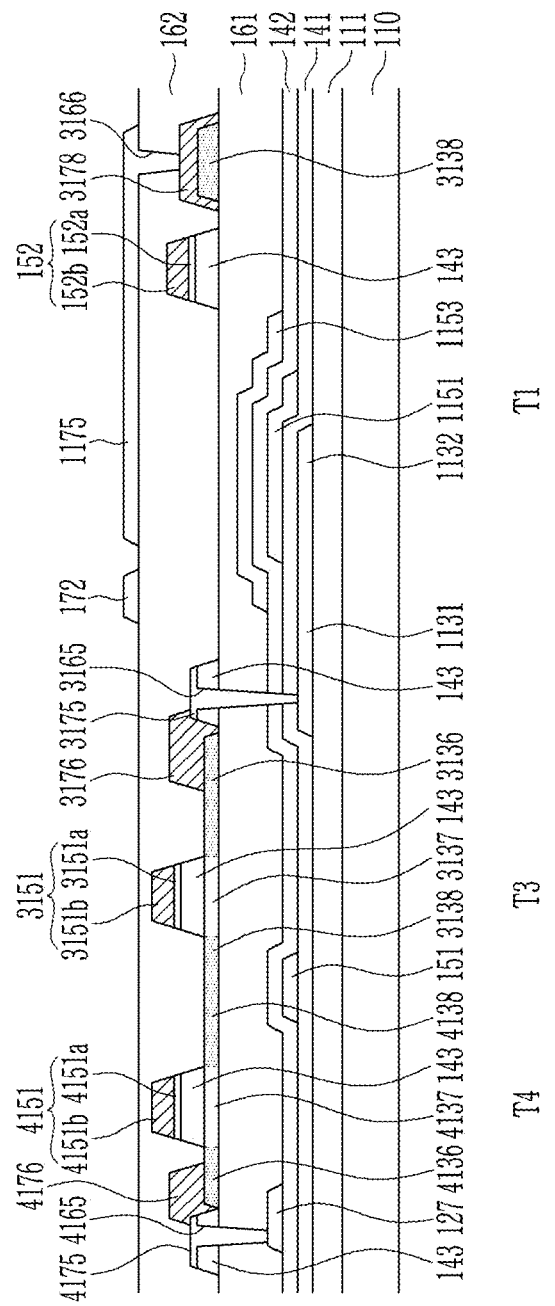
FIG. 27 is a cross-sectional view of FIG. 26, taken along line XXVII-XXVII.

A display device in an embodiment shown in FIG. 26 and FIG. 27 is substantially the same as the display device in the embodiment shown in FIG. 1 to FIG. 18, and therefore the same portions will not be described. The illustrated embodiment is different from the above-described embodiment in that an upper first connection electrode does not overlap a part of a lower first connection electrode, and an upper second connection electrode does not overlap a part of a lower second connection electrode, and this will be described hereinafter in detail.

FIG. 26 is a top plan view of a pixel of a display device in an embodiment, and FIG. 27 is a cross-sectional view of FIG. 26, taken along line XXVII-XXVII.

As in the above-described embodiment, in a pixel of a display device in the illustrated embodiment includes a plurality of transistors T1, T2, T3, T4, T5, T6, and T7 connected to a plurality of wires 127, 151, 152, 153, 154, 155, 171, 172, and 741, a storage capacitor Cst, and a light emitting diode LED.

In the above-described embodiment, an upper first connection electrode 3176 may overlap an entirety of the lower first connection electrode 3175. That is, the upper first connection electrode 3176 may cover an entirety of the top surface of the lower first connection electrode 3175. In addition, the upper second connection electrode 4176 may overlap an entirety of the lower second connection electrode 4175. That is, the upper second connection electrode 4176 may cover an entirety of the top surface of the lower second connection electrode 4175.

In the illustrated embodiment, as shown in FIG. 26 and FIG. 27, the upper first connection electrode 3176 may overlap a part of the lower first connection electrode 3175, and may not overlap a part of the rest. That is, the upper first connection electrode 3176 may cover a part of the top surface of the lower first connection electrode 3175. Thus, a part of the top surface of the lower first connection electrode 3175 may not be covered by the upper first connection electrode 3176. The area and position where the upper first connection electrode 3176 overlaps the lower first connection electrode 3175 may be variously changed. In addition, the upper second connection electrode 4176 may overlap a part of the lower second connection electrode 4175 and may not overlap a part of the rest. That is, the upper second connection electrode 4176 may cover a part of the top surface of the lower second connection electrode 4175. Therefore, a part of the top surface of the lower second connection electrode 4175 may not be covered by the upper second connection electrode 4176. The area and position where the upper second connection electrode 4176 overlaps the lower second connection electrode 4175 may be changed in various ways.

Similarly, the upper gate electrode 3151b of the third transistor T3 overlaps an entirety of the lower gate electrode 3151a, but this is not restrictive, and may be various modified. The upper gate electrode 3151b of the third transistor T3 may overlap a part of the lower gate electrode 3151a. In addition, the upper gate electrode 3151b of the third transistor T3 may cover the top and side surfaces of the lower gate electrode 3151a. Further, the upper gate electrode 4151b of the fourth transistor T4 is illustrated to overlap an entirety of the lower gate electrode 4151a, but is not limited thereto and may be variously changed. The upper gate electrode 4151b of the fourth transistor T4 may overlap a part of the lower gate electrode 4151a. In addition, the upper gate electrode 4151b of the fourth transistor T4 may cover the top and side surfaces of the lower gate electrode 4151a.

While this invention has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

What is claimed is:

1. A display device comprising:
  a substrate;
  a first transistor comprising:
    a channel which is disposed on the substrate;
    a first electrode and a second electrode respectively disposed at opposite sides of the channel of the first transistor; and
    a gate electrode overlapping the channel of the first transistor;
  a first interlayer insulation layer which is disposed on the first electrode and the second electrode of the first transistor;
  a second transistor comprising:
    a channel which is disposed on the first interlayer insulation layer;
    a first electrode and a second electrode respectively disposed at opposite sides of the channel of the second transistor; and
    a gate electrode which overlaps the channel of the second transistor;
  a first connection electrode which is disposed on the first interlayer insulation layer, and connected with the first electrode of the first transistor;
  a gate insulation layer which is disposed between the first interlayer insulation layer and the first connection electrode; and
  a second connection electrode which connects the first connection electrode and the first electrode of the second transistor,
  wherein the second connection electrode is disposed on the first connection electrode and the first electrode of the second transistor, and
  the second connection electrode covers an upper surface and a side surface of the first connection electrode and an upper surface and a side surface of the first electrode of the second transistor.

2. The display device of claim 1, wherein a planar shape of the first connection electrode is the same as a planar shape of the gate insulation layer.

3. The display device of claim 1, wherein the gate electrode of the second transistor comprises a first gate electrode and a second gate electrode,
  the gate insulation layer is further disposed between the first gate electrode of the second transistor and the channel of the second transistor,
  the first connection electrode is disposed in a same layer as the first gate electrode of the second transistor, and
  the second connection electrode is disposed in a same layer as the second gate electrode of the second transistor.

4. The display device of claim 1, wherein the channel, the first electrode, and the second electrode of the first transistor comprise a polycrystalline semiconductor material, and
  the channel, the first electrode, and the second electrode of the second transistor comprise an oxide semiconductor material.

5. The display device of claim 1, further comprising:
  an initialization voltage line which is disposed on the substrate;
  a third transistor comprising:
    a channel disposed on the first interlayer insulation layer;
    a first electrode and a second electrode of the third transistor, respectively disposed at opposite sides of the channel of the third transistor; and
    a gate electrode overlapping the channel of the third transistor;
  a third connection electrode which is connected to the initialization voltage line; and
  a fourth connection electrode which is disposed directly above the third connection electrode and the first electrode of the third transistor,
  wherein the first interlayer insulation layer and the gate insulation layer are further disposed between the initialization voltage line and the third connection electrode,
  a first opening which overlaps the initialization voltage line is defined in the first interlayer insulation layer and the gate insulation layer,
  the third connection electrode is connected with the initialization voltage line through the first opening, and
  the second electrode of the third transistor and the second electrode of the second transistor are connected to each other.

6. The display device of claim 1, further comprising a light blocking layer which overlaps the channel and the gate electrode of the second transistor,
  wherein the first interlayer insulation layer and the gate insulation layer are further disposed between the light blocking layer and the gate electrode of the second transistor,
  a first opening which overlaps the light blocking layer is defined in the first interlayer insulation layer and the gate insulation layer, and
  the gate electrode of the second transistor is connected with the light blocking layer through the first opening.

7. The display device of claim 1, further comprising a first storage electrode which overlaps the gate electrode of the first transistor,
wherein the first storage electrode includes a same material as a material of the channel, the first electrode, and the second electrode of the second transistor, and is disposed in a same layer as the channel, the first electrode, and the second electrode of the second transistor.

8. The display device of claim 1, further comprising a protection pad which is disposed on the second electrode of the second transistor,
wherein the protection pad is disposed in a same layer as the second connection electrode.

9. The display device of claim 8, further comprising:
a second interlayer insulation layer which is disposed on the protection pad; and
a third connection electrode which is disposed on the second interlayer insulation layer, and connects the gate electrode of the first transistor and the protection pad,
wherein a first opening which overlaps the protection pad is defined in the second interlayer insulation layer, and
the third connection electrode is connected with the protection pad through the first opening.

10. The display device of claim 1, wherein the second connection electrode is disposed directly above the first connection electrode, and the second connection electrode and the first connection electrode contact each other.

11. The display device of claim 10, wherein the second connection electrode is disposed directly above the first electrode of the second transistor, and the second connection electrode and the first electrode of the second transistor contact each other.

12. The display device of claim 11, wherein a first opening which overlaps at least a part of the first electrode of the first transistor is defined in the first interlayer insulation and the gate insulation layer, and
the first connection electrode is connected with the first electrode of the first transistor through the first opening.

13. A manufacturing method of a display device, the method comprising:
forming a channel of a first transistor on a substrate, and a first electrode and a second electrode respectively disposed at opposite sides of the channel;
forming a gate electrode of the first transistor, overlapping the channel of the first transistor;
forming a first interlayer insulation layer on the gate electrode of the first transistor;
forming a channel of a second transistor on the first interlayer insulation layer, and a first electrode and a second electrode which are respectively disposed at opposite sides of the channel of the second transistor;
forming a gate insulation layer on the channel, the first electrode, and the second electrode of the second transistor, and the first interlayer insulation layer;
defining a first opening which overlaps the first electrode of the first transistor in the gate insulation layer and the first interlayer insulation layer;
forming a first connection electrode which is connected with the first electrode of the first transistor through the first opening on the gate insulation layer;
removing a portion of the gate insulation layer, disposed on the first electrode of the second transistor by etching the gate insulation layer using the first connection electrode as a mask; and
forming a second connection electrode which connects the first connection electrode and the first electrode of the second transistor.

14. The manufacturing method of the display device of claim 13, wherein a planar shape of the first connection electrode is the same as a planar shape of the gate insulation layer.

15. The manufacturing method of the display device of claim 13, wherein the channel, the first electrode, and the second electrode of the first transistor comprise a polycrystalline semiconductor material, and
the channel, the first electrode, and the second electrode of the second transistor comprise an oxide semiconductor material.

16. The manufacturing method of the display device of claim 13, further comprising forming a light blocking layer which overlaps the channel and the gate electrode of the second transistor,
a second opening which overlaps the light blocking layer is defined in the defining the first opening,
a first gate electrode of the second transistor, connected with the light blocking layer through the second opening, is formed in the forming the first connection electrode, and
a second gate electrode of the second transistor is formed on the first gate electrode of the second transistor in the forming the second connection electrode.

17. The manufacturing method of the display device of claim 13, wherein a first storage electrode which overlaps the gate electrode of the first transistor is formed in the forming the channel, the first electrode, and the second electrode of the second transistor.

18. The manufacturing method of the display device of claim 13, wherein the second connection electrode is disposed directly above the first connection electrode, and the second connection electrode and the first connection electrode contact each other.

19. The manufacturing method of the display device of claim 18, wherein the second connection electrode is disposed directly above the first electrode of the second transistor, and the second connection electrode and the first electrode of the second transistor contact each other.

20. The manufacturing method of the display device of claim 13, wherein, in the forming the first connection electrode, a first gate electrode of the second transistor overlaps the channel of the second transistor,
in the forming the second connection electrode,
a second gate electrode of the second transistor overlaps the channel of the second transistor.

21. The manufacturing method of the display device of claim 20, wherein the second gate electrode of the second transistor is disposed directly above the first gate electrode of the second transistor, and the second gate electrode of the second transistor and the first gate electrode of the second transistor contact each other.

22. The manufacturing method of the display device of claim 13, wherein, in the forming the second connection electrode, a protection pad is formed on the second electrode of the second transistor.

23. The manufacturing method of the display device of claim 22, further comprising:
forming a second interlayer insulation layer on the protection pad;
defining a second opening which overlaps the protection pad in the second interlayer insulation layer; and forming a third connection electrode which is connected with the protection pad through the second opening on the second interlayer insulation layer, wherein the third connection electrode connects the gate electrode of the first transistor and the protection pad.

24. The manufacturing method of the display device of claim 13, further comprising forming an initialization voltage line on the substrate, wherein in the forming the channel, the first electrode, and the second electrode of the second transistor, a channel of a third transistor, disposed on the first interlayer insulation layer, and a first electrode and a second electrode which are respectively disposed at opposite sides of the channel of the third transistor are formed, in the defining the first opening, a second opening which overlaps the initialization voltage line is formed in the gate insulation layer and the first interlayer insulation layer, in the forming the first connection electrode, a third connection electrode which is connected with the initialization voltage line through the second opening is formed, in the removing of the portion of the gate insulation layer, disposed on the first electrode of the second transistor, a portion of the gate insulation layer, disposed on the first electrode of the third transistor is removed by etching the gate insulation layer using the third connection electrode as a mask, and forming a fourth connection electrode which connects the third connection electrode and the initialization voltage line in the forming the second connection electrode.

25. The manufacturing method of the display device of claim 24, wherein the fourth connection electrode is disposed directly above the third connection electrode, and the fourth connection electrode and the third connection electrode contact each other.

26. The manufacturing method of the display device of claim 25, wherein the fourth connection electrode is disposed directly above the first electrode of the third transistor, and the fourth connection electrode and the first electrode of the third transistor contact each other.

* * * * *